United States Patent
Hashimoto

(10) Patent No.: US 8,210,789 B2
(45) Date of Patent: Jul. 3, 2012

(54) METHOD OF ASSEMBLING SUBSTRATE TRANSFER DEVICE AND TRANSFER SYSTEM UNIT FOR THE SAME

(75) Inventor: Yasuhiko Hashimoto, Kobe (JP)

(73) Assignee: Kawasaki Jukogyo Kabushiki Kaisha, Kobe-Shi (JP)

( * ) Notice: Subject to any disclaimer, the term of this patent is extended or adjusted under 35 U.S.C. 154(b) by 0 days.

(21) Appl. No.: 13/017,552

(22) Filed: Jan. 31, 2011

(65) Prior Publication Data

US 2011/0123300 A1    May 26, 2011

Related U.S. Application Data

(63) Continuation of application No. 11/366,622, filed on Mar. 3, 2006, now abandoned.

(30) Foreign Application Priority Data

Mar. 7, 2005   (JP) ................................. 2005-062827

(51) Int. Cl.
   *H01L 21/677*   (2006.01)
(52) U.S. Cl. ....................................... 414/217; 414/937
(58) Field of Classification Search .................. 414/217, 414/937; 403/323; 70/207, 209
   See application file for complete search history.

(56) References Cited

U.S. PATENT DOCUMENTS

| | | | | |
|---|---|---|---|---|
| 2,581,816 A | * | 1/1952 | Schlueter | ...................... 52/582.2 |
| 5,244,710 A | * | 9/1993 | Bricher et al. | ................ 428/100 |
| 5,364,219 A | * | 11/1994 | Takahashi et al. | ............ 414/217 |
| 5,655,869 A | | 8/1997 | Scheler et al. | |
| 5,783,834 A | | 7/1998 | Shatas | |
| 5,984,610 A | | 11/1999 | Rush et al. | |
| 6,138,721 A | | 10/2000 | Bonora et al. | |
| 6,520,727 B1 | | 2/2003 | Babbs et al. | |
| 6,883,770 B1 | * | 4/2005 | Miyajima et al. | ............. 248/544 |
| 7,607,879 B2 | * | 10/2009 | Hall et al. | ..................... 414/217 |
| 2003/0044268 A1 | | 3/2003 | Bonora et al. | |
| 2003/0091409 A1 | | 5/2003 | Danna et al. | |
| 2004/0127028 A1 | * | 7/2004 | Okabe et al. | .................. 438/689 |
| 2004/0167743 A1 | | 8/2004 | Hosek | |
| 2005/0055134 A1 | | 3/2005 | Okuda et al. | |

FOREIGN PATENT DOCUMENTS

| | | |
|---|---|---|
| JP | A 2003-45933 | 2/2003 |
| WO | WO 03/009347 A2 | 1/2003 |
| WO | WO 2004/096502 A1 | 11/2004 |

* cited by examiner

*Primary Examiner* — Gregory Adams
*Assistant Examiner* — Jonathan Snelting
(74) *Attorney, Agent, or Firm* — Oliff & Berridge, PLC

(57) ABSTRACT

An assembly method of assembling a substrate transfer device including: a transfer system unit forming step of fixing a robot and a substrate container retainer to a divided body which composes a part of the substrate transfer device and is formed separably on a main structural body as a residual part of the substrate transfer device, thereby forming a transfer system unit; an operation examination step of examining whether the robot fixed to the transfer system unit can operate as a part of the substrate transfer device or not; and a mounting step of mounting the transfer system unit on the main structural body of the substrate transfer device after the operation examination step.

4 Claims, 18 Drawing Sheets

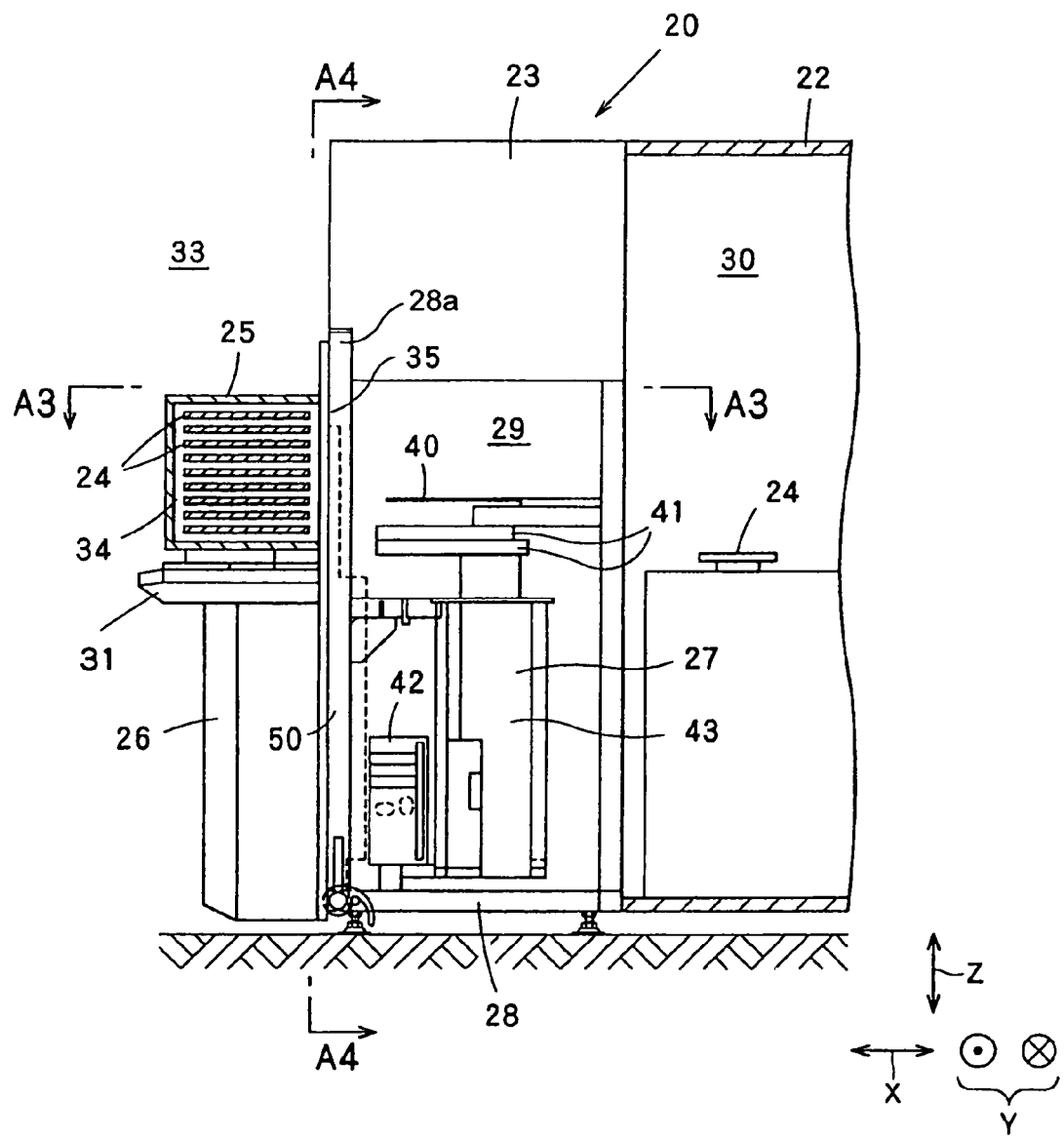
F I G. 1

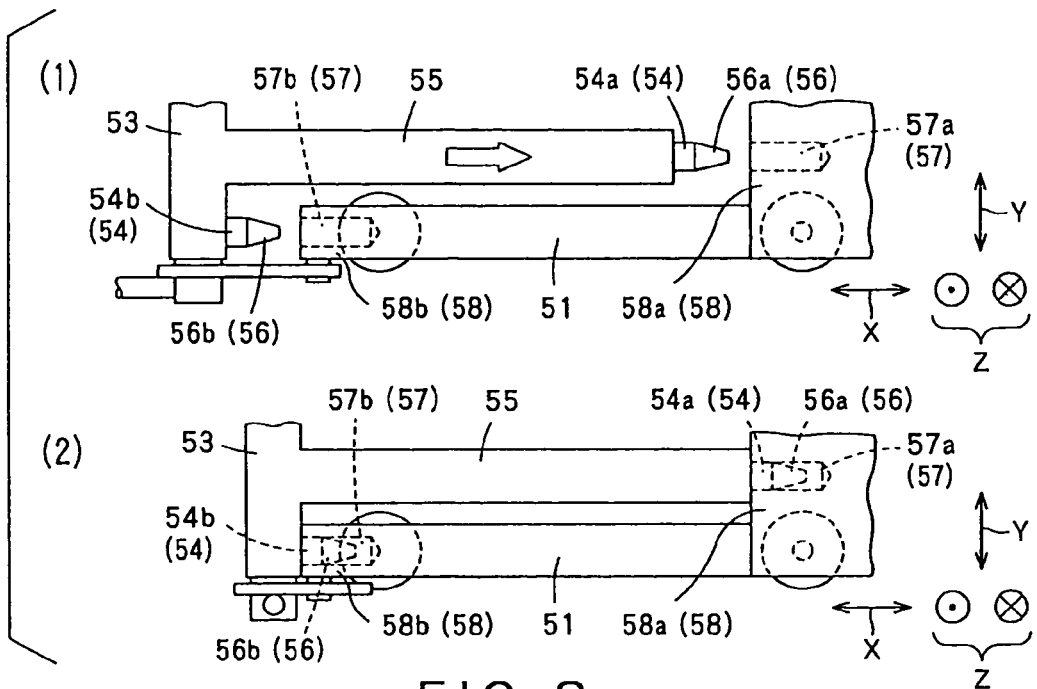
F I G. 8
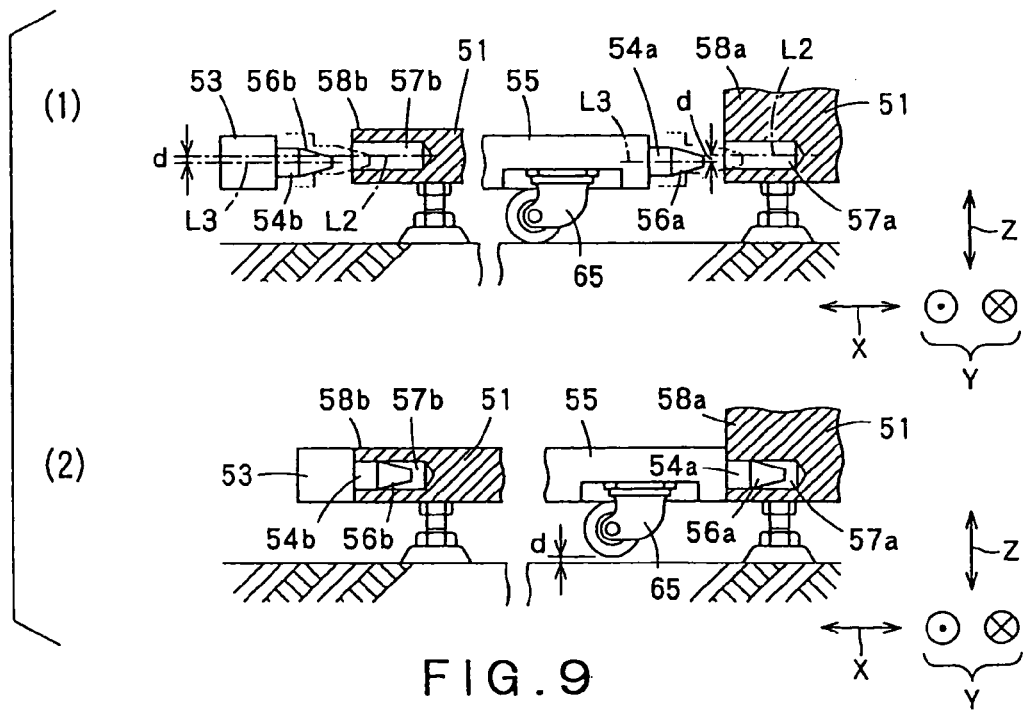
F I G. 9

METHOD OF ASSEMBLING SUBSTRATE TRANSFER DEVICE AND TRANSFER SYSTEM UNIT FOR THE SAME

This is a Continuation of application Ser. No. 11/366,622 filed Mar. 3, 2006. The disclosure of the prior application is hereby incorporated by reference herein in its entirety.

CROSS REFERENCE TO RELATED APPLICATIONS

This application is base upon the prior Japanese Patent Application No. 2005-62827 filed on Mar. 7, 2005, the entire contents of which are incorporated herein by reference.

BACKGROUND

1. Field of the Invention

The present invention is related to a substrate transfer device of substrate processing equipment for transferring a substrate and more particularly to a substrate transfer device of semiconductor processing equipment, namely, so-called equipment front end module (EFEM).

2. Description of the Related Art

FIG. 18 is a sectional view showing a cut part of a semiconductor processing equipment 1 of the related art. The semiconductor processing equipment 1 is structured so as to include a wafer processing unit 2 and a wafer transfer device 3. The space in the semiconductor processing equipment 1 is filled with a predetermined atmospheric gas. Therefore, wafers 4 to be processed are prevented from adhesion of foreign substances floating in the air. The semiconductor wafers 4 are transferred to the semiconductor processing equipment in the state that they are stored in a FOUP (front opening unified pod) 5.

The wafer transfer device 3 takes out the wafers 4 before processing from the FOUP 5 and supplies them to the waver processing unit 2, and takes out the wafers 4 after processing from the wafer processing unit 2 and re-stores them in the FOUP 5. Concretely, the wafer transfer device 3 includes a FOUP opener 6 (hereinafter, referred to as an opener 6) and a robot 7. As one of preparation space forming wall 8, a wafer opening through which the wafers 4 can pass is formed. The opener 6 is installed in the neighborhood of the wafer opening and outside the preparation space, a FOUP retainer 11 for retaining the FOUP 5 is formed. Further, the opener 6 has a door for closing the wafer opening and can close tightly a preparation space 9 for the outside space.

The opener 6, in the state of prevention of entry of the air, opens the door of the FOUP 5 held by the FOUP retainer 11 and the door for closing the opening of the preparation space forming wall 8 and interconnects the intra-FOUP space and the preparation space 9. In this state, the robot 7 transfers the wafers 4 from the FOUP 5 to the wafer processing unit 2 and transfers the wafers 4 from the wafer processing unit 2 to the FOUP 5. The opener 6 closes the doors of the FOUP 5 and preparation space forming wall 8, thus the FOUP 5 and preparation space 9 are closed tightly from the air and the FOUP 5 can be separated from the semiconductor processing unit 1. For example, this related art is disclosed in Japanese Patent Laid-Open Publication 2003-45933.

FIG. 19 is a flow chart showing the conventional assembly procedure of the wafer transfer device 3 which is performed by an assembly company. Firstly, when the assembly operator completes preparation of the members composing the preparation space 9, the operator goes to Step a1 and starts assembly of the wafer transfer device 3. At Step a1, the operator forms the preparation space 9 in the installation place where the wafer transfer device 3 is installed and goes to Step a2.

At Step a2, the operator prepares the constituent devices composing the wafer transfer device 3 such as the opener 6 and robot 7 and installs them in the preparation space 9. When the installation of the constituent devices 6 and 7 is completed, the operator goes to Step a3. At Step a3, the operator adjusts so that the position and posture of each of the constituent devices 6 and 7 and the relative location relationship are set within predetermined tolerances and goes to Step a4.

At Step a4, the operator connects the power wires and signal wires so that the constituent devices 6 and 7 can operate and goes to Step a5. At Step a5, the operator operates actually the robot 7, teaches the operation positions necessary for the robot 7 to transfer the wafers 4, such as the position of the robot 7, the wafer arrangement position set in the wafer processing unit 1, and the movement-passing position to the robot 7, and goes to Step a6. At Step a6, the operator operates the robot 7 and confirms the operation and when the operation confirmation is completed, the assembly of the wafer transfer device 3 is completed.

FIG. 20 is a flow chart showing the operation procedure from manufacture to shipment of the robot 7 for the wafer transfer device which is performed by a robot manufacturer. Firstly, the robot manufacturer, when the preparation of a plurality of constituent parts composing robot 7 is completed, goes to Step b1 and starts operation. At Step b1, the robot manufacturer assembles the robot 7 on the assembly table and goes to Step b2. At Step b2, the robot manufacturer moves the robot 7 from the assembly table to the test table and connect wires, and then goes to Step b3. At Step b3, the robot manufacturer examines the operation of the robot 7. Concretely, the robot manufacturer allows the robot 7 to perform a simulation operation simulating the operation to be performed actually by the robot 7 and confirms that the required quality is achieved, and then goes to Step b4. At Step b4, the robot manufacturer disconnects the wires, and then goes to Step b5. At Step b5, the robot manufacturer moves the robot 7 from the test table to the shipment table, transfers it to the installation place where the wafer transfer device 3 is installed, and finished the operation.

In the related art aforementioned, in the installation place of the wafer transfer device 3, it is necessary for the assembly company to sequentially perform the installation operation of the robot 7, position adjustment operation, wire connection operation, position teaching operation, and operation confirmation operation. At each step, a technical skill on a predetermined or higher level is required and a long period of time is taken to complete each operation step. For example, when installing the opener 6 and robot 7 and adjusting each position, it is necessary to strictly perform installation adjustment respectively for the opener 6 and robot 7 so as to put each levelness within the tolerance.

Further, when performing position teaching for the robot 7, to teach the position of the FOUP 5 to be positioned to the FOUP retainer 11, the operator of the assembly company teaches the robot 7 by moving the robot hand. Further, when installing another constituent device, for example, an aligner on the wafer transfer device 3 or installing a buffer position for temporarily preserving the wafer 4, it is necessary to teach those positions to the robot 7. When an operator trained insufficiently performs the teaching operation, a teaching error is caused easily. Due to a teaching error during the teaching operation, there is a possibility that the operation time by the robot is prolonged undesirably or interference occurs during the robot operation, thus the units may be damaged. Therefore, to perform skillfully the operation at each operation step, a sufficient training term and a sufficient operation term are necessary.

On the other hand, the robot manufacturer, to ensure the quality of the robot 7, often executes a test of a simulation operation for simulating the operation to be actually performed by the robot 7. At this time, the robot manufacturer prepares a simulation preparation space and a simulation opener for simulating the preparation space 9 and opener 6. And, using those simulation structures, the robot manufacturer performs the almost same operations as the installation operation, position adjustment operation, wire connection operation, position teaching operation, and operation confirmation operation which are to be performed in the installation place of the wafer transfer device 3 in the robot manufacturing place. And, after end of the test of simulation operation, for shipment, it is necessary to separate the robot 7 from the simulation structures.

As mentioned above, in the assembly method by the related art for the wafer transfer device 3, technical skill on a predetermined or higher level and a long period of time of assembly are required for the assembly company. On the other hand, viewed from the whole flow including manufacture of the robot, an operation similar to the test of simulation operation executed by the robot manufacturer is performed at time of assembly, and as an operation unrelated to the actual assembly, a joint/separation operation of the robot for the simulation structures is performed, and an inefficient operation occurs. Such a problem is caused similarly for a substrate other than the semiconductor wafer, for example, a glass substrate.

SUMMARY

Therefore, an object of the present invention is to provide a method of assembling a substrate transfer device and a structure of the same which are able to make it easy to perform assembly operation so as to improve the operation efficiency.

The present invention is an assembly method of assembling a substrate transfer device including a robot and a substrate container retainer for transferring a substrate to or from a substrate processing device which processes a substrate in a predetermined atmosphere, comprising: a transfer system unit forming step of fixing the robot and the substrate container retainer to a divided body which composes a part of the substrate transfer device and is formed separably on a main structural body as a residual part of the substrate transfer device, thereby forming a transfer system unit; an operation examination step of examining whether the robot fixed to the transfer system unit can operate as a part of the substrate transfer device or not; and a mounting step of mounting the transfer system unit on the main structural body of the substrate transfer device after the operation examination step.

Preferably, at the transfer system unit forming step, a substrate standby unit, on which a substrate is temporarily arranged by the robot, is additionally fixed to the divided body, thereby the transfer system unit is formed.

Preferably, at the operation examination step, a simulation operation simulating an operation of the robot which operates as the substrate transfer device is performed by the robot.

Preferably, the assembly method further comprising a transfer step of, after the transfer system unit forming step and the operation examination step have been executed in a robot manufacturing place where the robot is manufactured, transferring the transfer system unit to an installation place where the substrate transfer device is installed.

The present invention is a transfer system unit composing a part of a substrate transfer device for transferring a substrate to or from a substrate processing device for processing a substrate in a predetermined atmosphere, comprising: a divided body removably formed on the main structural body; a robot fixed to the divided body; and a substrate container retainer fixed to the divided body, wherein the transfer system unit is configured to be removably mounted on a main structural body as a residual part of the substrate transfer device, and wherein the transfer system unit is formed so that, when the divided body is mounted on the main structural body, the robot and the substrate container retainer are respectively arranged in predetermined arrangement positions where the robot and the substrate container retainer are respectively to be positioned as parts of the substrate transfer device.

Preferably, the transfer system unit keeps a self supporting posture when the transfer system unit is separated from the main structural body.

Preferably, in a state that the transfer system unit is separated from the main structural body, the transfer system unit can perform the same operation as an operation when the transfer system unit operates as the substrate transfer device.

Preferably, in the state that the transfer system unit is separated from the main structural body, the robot and the substrate container retainer keep the same postures as postures when the robot and the substrate container retainer operate as parts of the substrate transfer device.

Preferably, the divided body comprises a mounting section configured to be mounted in a mounting position formed in the main structural body and a guidance section configured to guide the mounting section to the mounting position.

The present invention is a divided body composing a part of a substrate transfer device for transferring a substrate to or from a substrate processing device which processes the substrate in a predetermined atmosphere, wherein the divided body is configured to be removably mounted on a main structural body which is a residual part of the substrate transfer device, the divided body comprising: a fixing section to which, among a plurality of structural bodies composing the substrate transfer device, a plurality of transfer structural bodies relating to a transfer of substrates are fixed; and a mounting section configured to be removably mounted on the main structural body, wherein when the mounting section is mounted on the main structural body, the transfer structural bodies fixed to the fixing section are respectively arranged in predetermined arrangement positions where the transfer structural bodies are to be positioned as the substrate transfer device.

According to the assembly method of the present invention, at the transfer system unit forming step, at least the robot and substrate container retainer are integrally fixed to the divided body separated from the main structural body, thus the transfer system unit is formed. And, before assembling as a substrate transfer device, at the operation examination step, it is examined whether the robot fixed to the transfer system unit can operate as a part of the substrate transfer device or not. When the ability required as a part of the substrate transfer device is realized, the process goes to the mounting step. At the mounting step, the transfer system unit, which has passed the operation examination step, is integrally mounted on the main structural body, thus the substrate transfer device is completed.

According to the present invention, at the transfer system unit forming step, the robot and substrate container retainer are positioned to the divided body, thus before assembling as a substrate transfer device, the positional relationship between the robot and the substrate container retainer can be adjusted. Further, before assembling as a substrate transfer device, the operation examination of the robot relating to access to the substrate container retained by the substrate container retainer can be executed.

In the substrate transfer device, high assembly accuracy is required and a strict operation examination is executed for the constituent devices composing the substrate transfer system, i.e., the robot and substrate container retainer. As described above, according to the present invention, the assembly accuracy required for the substrate transfer system and the operation quality of the substrate transfer system can be obtained before assembly, so that there is no need to prepare a skilled operator and an exclusive jig required for executing the positioning and operation examination at each installation place for the substrate transfer device. Further, compared with a case that the positioning and operation examination are executed in the state that the robot and substrate container retainer are installed in the main structural body, those operations can be performed in a wide space.

Further, the transfer system unit and main structural body are assembled integrally in the state that the position adjustment of the robot and substrate container retainer and operation examination have already been executed, so that the position adjustment such as the horizontal adjustment executed after assembly and operation examination can be simplified. As mentioned above, according to the present invention, since the transfer system unit, in which the position adjustment and operation examination have already executed, is prepared, the assembly operation at the installation place of the substrate transfer device can be simplified and the substrate transfer device can be completed in a short time.

Further, according to the present invention, the substrate standby unit may be additionally included in the divided body, so that after the relative position adjustment between the robot and the substrate standby unit and the operation examination of the robot relating to access of the substrate to the substrate standby unit have already been completed, the transfer system unit can be mounted integrally on the main structural body. As mentioned above, according to the present invention, since the substrate standby unit is fixed to the divided body, the assembly operation in the installation place of the substrate transfer device can be simplified more and the substrate transfer device can be completed in a short time. For example, the substrate standby unit may be an aligner for adjusting the direction of the substrate, a thickness measuring instrument for measuring the thickness of the substrate, or a buffer unit for realizing high efficiency of substrate transfer.

Further, according to the present invention, at the operation examination step, in order to perform a simulation operation, the position of the substrate container retained by the substrate container retainer may be taught to the robot. The examination is executed by moving the robot to each teaching position and performing the simulation operation relating to substrate transfer by the robot. When the simulation operation is performed at the operation examination step like this, using the teaching position of the robot used in the simulation operation, the operation position of the robot operating actually can be set and the teaching operation of the operation position of the robot can be simplified.

Further, according to the present invention, the transfer system unit forming step and operation examination step may be executed in the robot manufacturing place, thus the robot quality can be ensured in the robot manufacturing place. Therefore, the examination by the simulation operation conventionally executed in the robot manufacturing place to ensure the robot quality and the operation examination executed in the installation place of the substrate transfer device can be unified, thereby the overall operation time can be shortened, and the operability can be improved. Further, the operation time in the installation place of the substrate transfer device can be shortened.

Further, when the transfer system unit forming step and operation examination step are executed in the robot manufacturing place, a skilled operator relating to the robot can position and fix the robot to the divided body and execute the teaching operation of the operation position of the robot and the operation examination. Therefore, each of the operations can be prevented from imperfection. Further, defects generated in each operation can be solved easily.

According to the transfer system unit of the present invention, when the divided body, to which the robot and substrate container retainer are fixed, is mounted on the main structural body, the robot and substrate container retainer are arranged in the arrangement position to be positioned as a substrate transfer device. Therefore, before the assembly operation of the substrate transfer device, the mutual positional relationship between the robot and the substrate container retainer can be adjusted.

The robot and substrate container retainer are a transfer structural body composing the substrate transfer system in the substrate transfer device and high assembly accuracy is required for them. According to the present invention, when the transfer system unit is formed, it can be confirmed whether the assembly accuracy required for the substrate transfer system is obtained or not, so that the position adjustment operation after the transfer system unit and main structural body are assembled integrally can be simplified and the substrate transfer device can be completed in a short time.

Further, when the transfer system unit is removably mounted on the substrate transfer device, if the substrate transfer device fails, the transfer system unit is separated from the main structural body and the operation of the robot fixed to the transfer system unit can be confirmed. By doing this, the robot and substrate container retainer are arranged in a wide space, thereby the operation can be confirmed and discovery of a faulty part and repair of the faulty part can be executed easily.

According to the present invention, the transfer system unit may be able to keep a self-supporting posture so that a frame for stably supporting the transfer system unit is not necessary. Therefore, the labor for preparing a frame and putting the transfer system unit on or down from the frame can be saved. By doing this, the expense for preparing the frame and the time required to put the transfer system unit on and down from the frame can be saved and the operability can be improved more.

Further, according to the present invention, the transfer system unit may be able to perform the same operation as that performed as a substrate transfer device. Therefore, before assembling as a substrate transfer device when the transfer system unit is completed, the operation examination of the robot relating to access of the substrate to the substrate container retained by the substrate container retainer can be performed. The transfer system unit, for which the operation examination has been finished, is mounted on the structural body of the main body and the substrate transfer device is completed, thus the operation examination after assembling as a substrate transfer device can be simplified. By doing this, the time required from assembling as a substrate transfer device to a state that it can operate as a substrate transfer device can be shortened.

Further, according to the present invention, the transfer system unit keeps the same posture as that when the robot and substrate container retainer operate as a substrate transfer device. Here, the same posture is the posture of the reference surface of the robot and substrate container retainer for the horizontal surface and vertical surface. Therefore, at time of the operation examination, the frame for keeping the transfer system unit in the same posture as that when it operates as a substrate transfer device is not required. Therefore, the labor for preparing a frame for the operation examination and putting the transfer system unit on or down from the frame can be saved, and the expense for preparing the frame and the time required to put the transfer system unit on or down from the frame can be saved, and the operability can be improved more.

Further, according to the present invention, the divided body, when mounting on the main structural body, is guided by the guidance section so that the mounting section is mounted at the mounting position. Therefore, the divided body and main structural body can be positioned and assembled easily.

Further, according to the present invention, the transfer constituent device can be fixed to the divided body in the state that the divided body is separated from the main structural body. Further, when the divided body, to which each transfer constituent device is fixed, is mounted on the main structural body, the transfer constituent devices are arranged in the arrangement positions to be positioned as a substrate transfer device. For example, the transfer constituent devices are realized by a robot, a FOUP opener, and an aligner.

Each transfer constituent device is fixed to the fixing section of the divided body, thus before assembling as a substrate transfer device, the mutual positional relationship between the transfer constituent devices can be adjusted. And, the divided body in which the transfer constituent devices are positioned is mounted on the main structural body so that the substrate transfer device is assembled. By doing this, after assembling the substrate transfer device, the adjustment operation for adjusting the positional relationship between the transfer constituent devices can be simplified and the substrate transfer device can be assembled in a short time.

BRIEF DESCRIPTION OF THE DRAWINGS

The above and other objects, features and advantages of the present invention will become more apparent from the following description taken in connection with the accompanying drawings, in which:

FIG. 1 is a sectional view showing a cut part of a semiconductor processing equipment 20 of a first embodiment of the present invention;

FIG. 8 includes front views showing a mounting section 54 of the frame divided body 50 which is enlarged;

FIG. 9 includes sectional views showing the mounting section 54 of the frame divided body 50 which is enlarged;

DETAILED DESCRIPTION OF EMBODIMENTS

Figure 2:
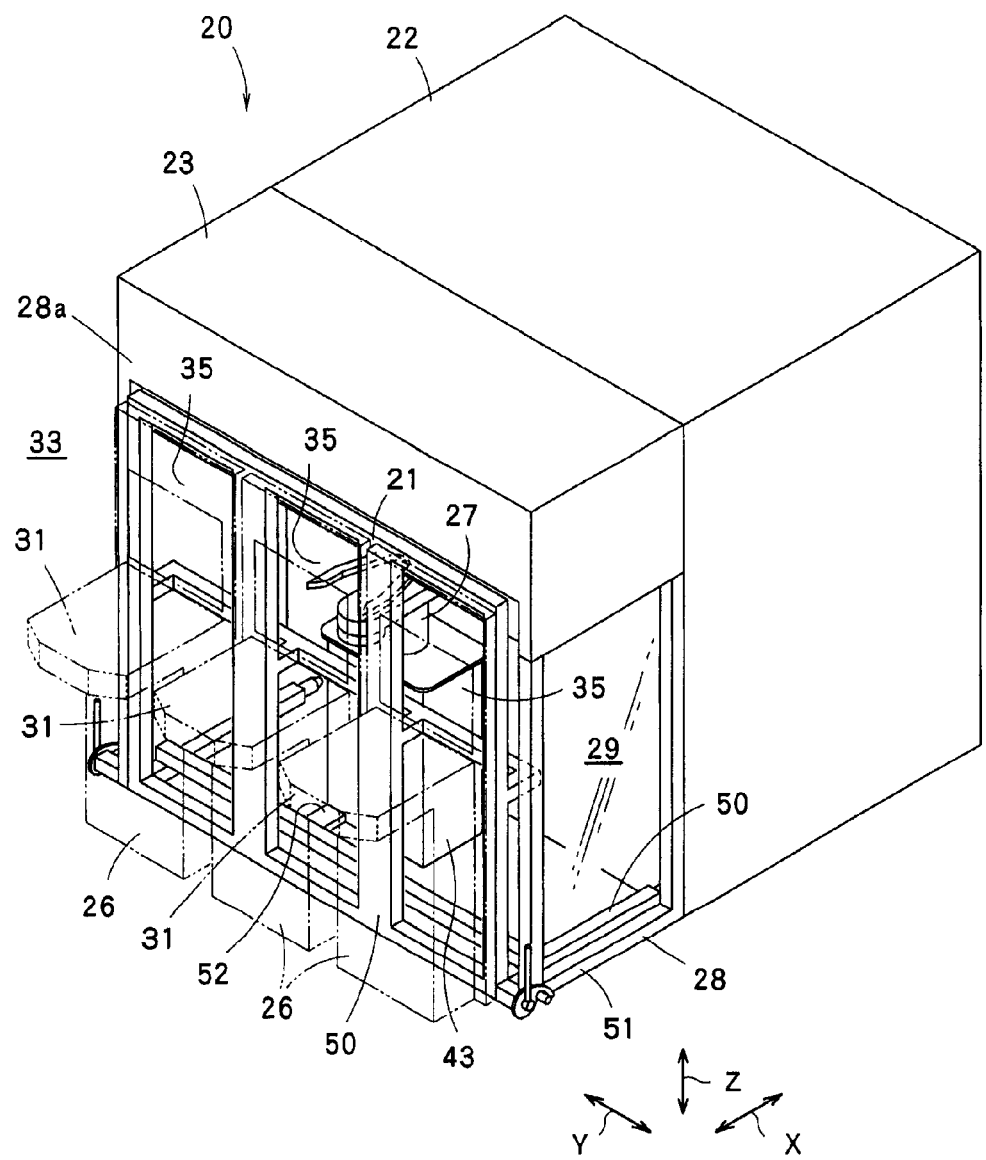
FIG. 2 is a perspective view showing the semiconductor processing equipment 20.
Figure 3:
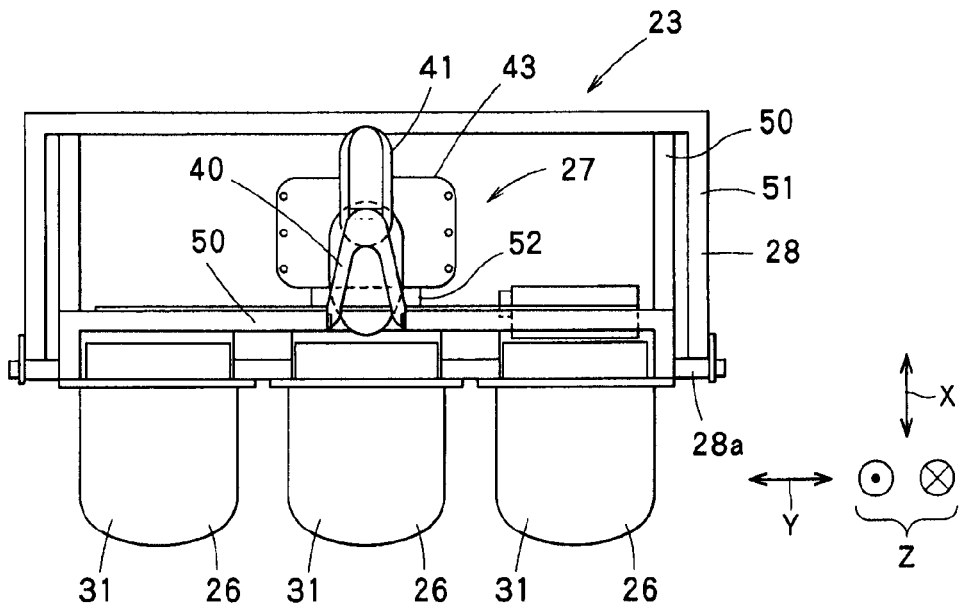
FIG. 3 is a sectional view showing the semiconductor processing equipment 20 cut along the sectional line of the arrow A3-A3 shown in FIG. 1.
Figure 4:
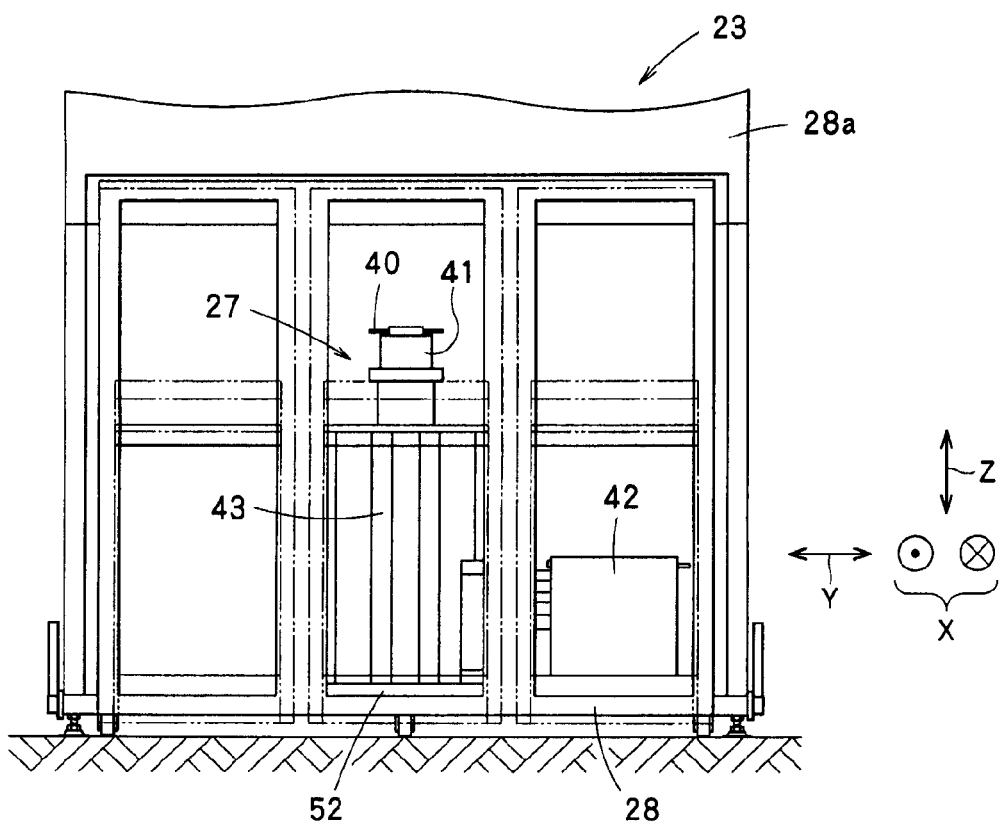
FIG. 4 is a sectional view showing the semiconductor processing equipment 20 cut along the sectional line of the arrow A4-A4 shown in FIG. 1.
Figure 5:
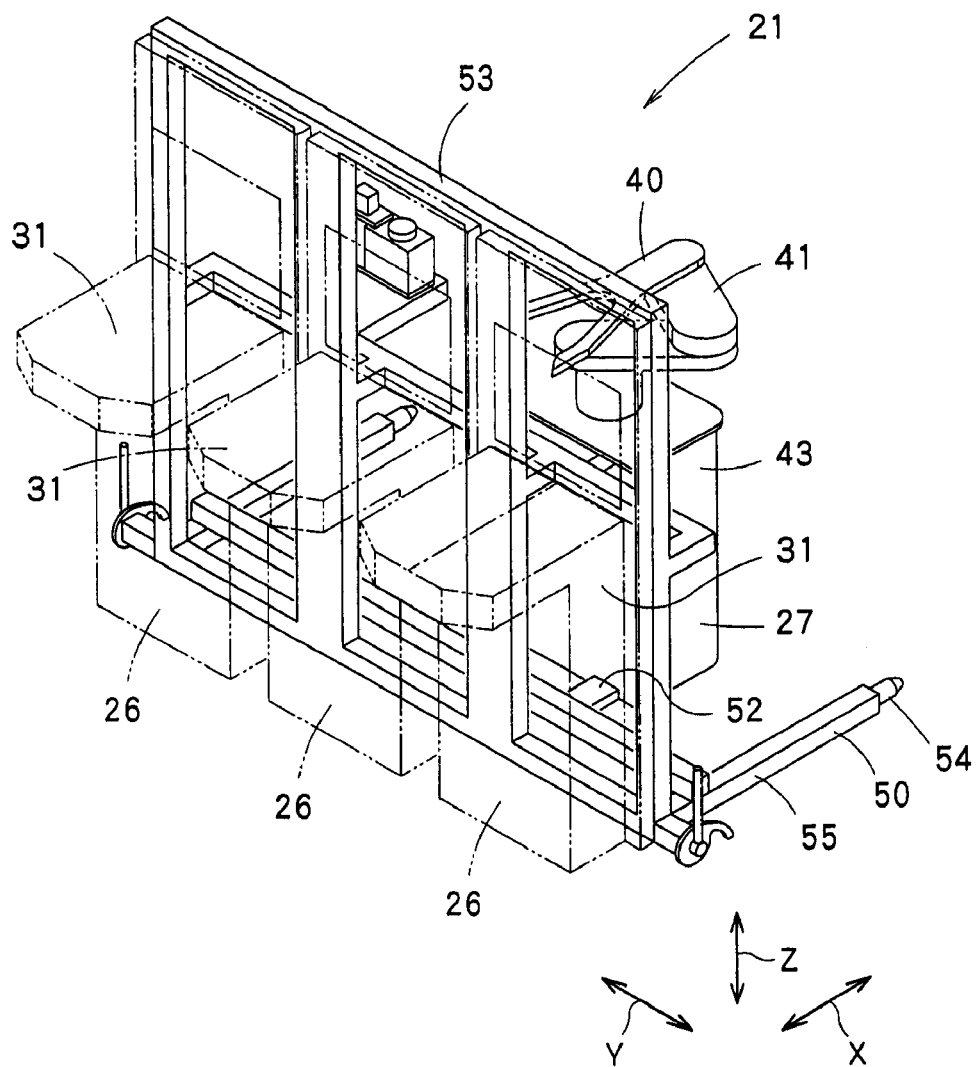
FIG. 5 is a perspective view showing a transfer system unit 21 partially omitted.

Referring to FIGS. 1 to 12, the first embodiment of the present invention will be explained hereunder. In FIG. 2, for easy understanding, with respect to FOUP openers 26, only the outline of each of them is drawn, so that the FOUP openers can be seen through.

The semiconductor processing unit 20 performs a predetermined process for semiconductor wafers 24 which are substrates to be processed. For example, as a process to be performed for the semiconductor wafers 24, various processes such as heat treatment, impurity introduction process, thin film forming process, lithographic process, cleaning process, and flattening process are supposed.

The semiconductor processing equipment 20 performs the aforementioned process in a processing space 30 filled with a predetermined atmospheric gas. In this embodiment, the wafers 24, in the state that they are stored in a substrate container referred to as a FOUP (front opening unified pod) 25, are transferred to the semiconductor processing equipment 20. A space 24 in the FOUP 25 is kept in a closed state for an outer space 33 and an FOUP side door for taking in and out the wafers 24 is formed.

The semiconductor processing equipment 20 is structured so as to include a wafer processing unit 22 and a wafer transfer device 23. The wafer processing unit 22 performs a predetermined process for wafers in the processing space 30 filled with the predetermined atmospheric gas. The wafer processing unit 22 includes the processing unit body for processing the wafers 24, a plurality of processing space forming walls for forming the processing space 30, a transfer device for transferring the wafers 24 in the processing space 30, and an adjustment device for adjusting the atmospheric gas filled in the processing space 30.

The wafer transfer device 23 takes out the wafers 24 before processing from the FOUP 25, supplies them to the wafer processing unit 22, and takes out the wafers 24 after processing from the wafer processing unit 22 and re-stores them in the FOUP 25. The wafer transfer device 23 is referred to as an equipment front end module (EFEM) and serves as an interface section for executing transfer of the wafers 24 from the FOUP 25 in the semiconductor processing equipment 20. The wafers 24, during moving between a space 34 in the FOUP 25 and the processing space 30 of the wafer processing unit 22, passes through a preparation space 29 filled with a predetermined atmospheric gas. Further, the preparation space 29 is formed as small as possible.

The wafer transfer device 23 includes a plurality of preparation space forming walls 28 for forming the preparation space 29, a robot 27 arranged in the preparation space 29 for transferring wafers, a FOUP opener 26 (hereinafter, referred to as an opener 6) for opening or closing the FOUP side door of the FOUP 25, and an adjustment device for adjusting the atmospheric gas filled in the preparation space 29.

The preparation space forming walls 28 surround the preparation space 29. On a front forming wall 28a which is at least one of the forming walls 28, a wafer opening 35 through which the wafers 24 can pass is formed. One side of the front forming wall 28a in the thickness direction is arranged on the side of the preparation space 29 and the other side in the thickness direction is arranged on the side of the outer space 33.

To the front forming wall 28a, one or a plurality of openers 26 (three in this embodiment) are fixed. Each of the openers 26 includes the FOUP retainer 31 for retaining the FOUP 25, an opener-side door for closing the wafer opening 35, and a switching means for driving the opener-side door to move so as to open and close the wafer opening 35. The FOUP retainer 31 is arranged on the side of the outer space 33 for the front forming wall 28a and holds the FOUP 25 transferred to the semiconductor processing equipment 20. The FOUP retainer 31 retains the FOUP 25, thereby positions the FOUP 25 at a predetermined retaining position. The FOUP 25 retained by the FOUP retainer 31 is arranged in a position where the opening formed in the FOUP 25 faces on the wafer opening 35.

The switching means, when opening the wafer opening 35, moves the FOUP-side door to the opening position together with the opener-side door in the state that the opening of the FOUP 25 retained by the FOUP retainer 31 is closely pressed against the front forming wall 28a. By doing this, the semiconductor processing equipment 20 is kept in the closed state for the outer space 33 and can interconnect the intra-FOUP space 34 and preparation space 29.

Further, the switching means, when closing the wafer opening 35, moves the FOUP-side door to the closing position together with the opener-side door in the state that the opening of the FOUP 25 retained by the FOUP retainer 31 is closely pressed against the front forming wall 28a. By doing this, the semiconductor processing equipment 20 is kept in the closed state for the outside space 33 and can cancel the interconnection between the intra-FOUP space 34 and the preparation space 29. And, when the interconnection between the intra-FOUP space 34 and the preparation space 29 is canceled, the FOUP 25 can be separated from the FOUP retainer 31. When transferring the wafers 24 to the semiconductor processing equipment 20 and transferring the wafers 24 from the semiconductor processing equipment 20 in this way, the wafers 24 can be prevented from exposing to the open air. Therefore, the wafers 24 processed are prevented from adhesion of foreign substances in the open air during processing. Such a constitution of the FOUP 25 and opener 26 is pre-specified by, for example, the SEMI (Semiconductor Equipment and Materials International) Standard.

The robot 27, in this embodiment, is realized by a horizontal multi-joint robot. The robot 27 is arranged in the preparation space 29 and includes a robot hand 40 for retaining the wafers 24, a robot arm 41 for moving the robot hand 40, a base 43 for supporting the robot arm 41, and a robot controller 42 for driving the robot arm 41 to move.

The robot hand 40 enters the intra-FOUP space 34 of the FOUP 25 and retains the wafers 24 stored in the FOUP 25. And, it passes through the preparation space 29, enters the processing space 30 of the semiconductor processing unit 22, and transfers the retained wafers 24 to a preset wafer arrangement position. Further, the robot hand 40 enters the processing space 30 and retains the wafers 24 retained in the wafer arrangement position. And, it passes through the preparation space 29, enters the intra-FOUP space 34, and transfers the retained wafers 24 to the storing position of the FOUP 25. In this embodiment, the openers 26 are installed at three places, so that the wafers 24 can be transferred in and out for the FOUPs 25 retained by the respective FOUP retainers 31 of the openers 26 at the three places.

Referring to FIGS. 1 to 5, the wafer transfer device 23 is formed so as to be divided into the transfer system unit 21 and the main structural body which is a residual part thereof. Concretely, the transfer system unit 21 is formed removably on the main structural body 51 of the wafer transfer device 23, and the transfer system unit 21 is mounted on the main structural body 51, so that it is completed as the wafer transfer device 23.

The main structural body 51 composes a part of the preparation space forming wall 28a and is composed of an FFU (fan filter unit) and an indicator lamp. The main structural body 51 is requested for lower assembly accuracy than that of the transfer system unit 21. The transfer system unit 21 includes a frame divided body 50 which is a part of the frame of the wafer transfer device 23, robot 27, and openers 26. The robot 27 and openers 26 are transfer structural bodies necessary to transfer the wafers 24.

The frame divided body 50 includes a robot fixing section 52 for fixing the robot 27, opener fixing sections 53 for fixing the openers 26, a mounting section 54 mounted on the main structural body 51, and a leg section 55 for keeping the self supporting posture. In this embodiment, the frame divided body 50 composes a part of the front forming wall 28a.

Further, the fixing sections 52 and 53, in this embodiment, fix respectively the robot 27 and openers 26 by the side mount method. However, the present invention is not limited to it and any fixing method is available. Concretely, the opener fixing sections 53 may fix a plurality of places including two places of the upper end and lower end of the opener 26 in the height direction. The robot fixing section 52 may fix both the base 43 which is a base of the robot 27 and the robot controller 42, fix a plurality of places of them including two places of the upper end and lower end in the height direction. Therefore, the devices 26 and 27 can be fixed stably.

Assuming the horizontal direction where the openers 26 are arranged side by side as a width direction Y and the horizontal direction perpendicular to the width direction as a wafer movement direction X, in this embodiment, the opener fixing sections 53 compose a part of the front forming wall 28a, extend in the vertical direction Z and width direction Y, and are formed in an almost laminal shape. Two leg sections 55 are formed and connected respectively to the lower ends of the opener fixing sections 53. Each of the leg sections 55 extends from both ends in the width direction Y of the lower end of the opener fixing sections 53 in the wafer movement direction X. Further, the legs 55 extend respectively to the positions away from the robot 27 in the wafer movement direction X for the opener fixing sections 53. Further, the robot fixing sections 53 extend in the width direction Y between the two legs 55 and are fixed respectively to the two legs 55. Such a shape of the frame divided body 50 is an example of the present invention and any other shape for fixing the robot 27 and openers 26 is acceptable.

The frame divided body 50, when it is mounted in the main structural body 51, is formed so that the robot 27 and openers 26 fixed to the frame divided body 50 are arranged respectively in the arrangement positions and postures to be positioned as a part of the wafer transfer device 23. Namely, when operating actually as the wafer transfer device 23, if the relative positional relationship between the robot 27 and each of the openers 26 is preset, the frame divided body 50 fixes the robot 27 and openers 26 respectively to the fixing sections 52 and 53 so that the robot 27 and openers 27 are set in the preset relative positional relationship.

By doing this, the robot 27 and openers 26 are fixed to the frame divided body 50, thus the relative positional relationship between the robot 27 and the openers 26 is adjusted already. Therefore, after the transfer system unit 21 is mounted on the main structural body 51, the labor for adjusting the relative position of the robot 26 and openers 26 can be saved.

Further, when operating actually as the wafer transfer device 23, if the positions of the reference points set in the robot 27 and openers 26 and the postures of the reference surfaces are preset, the robot 27 and openers 26 are fixed to the fixing sections 52 and 53 so as to put the positions of the reference points and the postures of the reference surfaces into the preset states in the state that the frame divided body 50 is mounted on the main structural body 51 of the wafer transfer device 23. By doing this, the robot 27 and openers 26 are fixed to the frame divided body 50, thus the positions and postures of the robot 27 and openers 26 are adjusted. Therefore, after the transfer system unit 21 is mounted on the main structural body 51, the labor for adjusting the positions and postures of the robot 26 and openers 26 can be reduced.

Namely, the robot 27 and openers 26 in the wafer transfer device 23 serve as a transfer structural body composing the wafer transfer system relating to transfer of the wafers 24. For assembly of the transfer system structural body, high assembly accuracy is required. In this embodiment, when assembling as the transfer system unit 21, the positions, postures, and relative positional relationship of the robot 27 and openers 26 can be adjusted. Therefore, after the transfer system unit 21 is mounted on the main structural body 51, the labor of the position adjustment and posture adjustment of the robot 27 and openers 26 can be reduced and the wafer transfer device 23 can be assembled in a short time. Further, compared with a case that the robot 27 and openers 26 are installed in the preparation space 29 of the main structural body 51, the positions of the robot 27 and openers 26 can be adjusted in a sufficiently wide space and the adjustment operation can be performed easily.

Further, the frame divided body 50 is formed so that, when the robot 27 and openers 26 are respectively fixed to the fixing sections 52 and 53, the robot 27 and openers 26 can perform the same operation as that when performed as a wafer transfer device 23. Namely, the frame divided body 50 is formed in the area where the wafer opening 35 is formed, the movable area necessary for the openers 26 to move the FOUP-side door and opener-side door, and the area excluding the operation area necessary for wafer transfer by the robot 27. By doing this, the robot 27 and openers 26, before being mounted on the main structural body 51, can operate in cooperation with each other.

Therefore, when the robot 27 and openers 26 are fixed to the frame divided body 50, the operation confirmation of the robot 27 and openers 26 can be performed individually. Furthermore, for the cooperative operation between the robot 27 and the openers 26, the operation confirmation can be performed. Concretely, the operation of retaining the wafers 24 stored in the FOUP 25 retained by the FOUP retainer 31 of the openers 26 by the robot hand 40 and the operation of storing the wafers 24 retained by the robot hand 40 in the FOUP retainer 31 of the openers 26 can be confirmed.

Therefore, after the transfer system unit 21 is mounted on the main structural body 51, the labor for the operation confirmation of the robot 27 and openers 26 can be reduced. Further, after assembly of the wafer transfer device 23, the preparation time required to put the wafer transfer device 23 into the movable state can be shortened. Further, compared with a case that the robot 27 and openers 26 are installed in the preparation space 29 of the main structural body 51, the operation confirmation of the robot 27 and openers 26 can be performed in a sufficiently wide space and the operation confirmation can be performed easily.

Further, the legs 55 formed on the frame divided body 50 make contact with the horizontal surface such as the floor surface, thus the transfer system unit 21 keeps the self-supporting posture. Namely, the center of gravity of the transfer system unit 21 is positioned between the two legs 55 in the width direction Y and positioned between the front ends of the legs 55 and the base ends thereof in the wafer movement direction X. Further, it is preferable that the center of gravity is positioned in the neighborhood of the center of the two legs 55 in the width direction Y and positioned between the front ends of the legs 55 and the neighborhood of the center of the base ends thereof in the wafer movement direction X. The transfer system unit 21 keeps the self-supporting posture in this way, thus at time of shipment of the transfer system unit 21, there is no need to separately put it on a shipment frame. Therefore, even if it is assembled in a place different from the installation place of the wafer transfer device 23 and the position adjustment and operation confirmation are executed, the transfer system unit 21 can be shipped to the installation place of the wafer transfer device 23 without putting the same on a shipment frame.

Further, when the transfer system unit 21 is kept in the self-supporting posture, the postures of the robot 27 and openers 26 are kept in the same postures as those when operating actually as the wafer transfer device 23. Concretely, when assembled as the wafer transfer device 23, if the reference horizontal surface kept horizontal is set in the robot 27 and openers 26, in the state that the transfer system unit 21 is kept in the self-supporting posture, the reference horizontal surfaces set in the robot 27 and openers 26 are kept horizontal.

Therefore, when executing the operation test of the transfer system unit 21 before it is assembled as the wafer transfer device 23, the robot 27 and openers 26 can be kept in the same posture as that of the wafer transfer device 23 and there is no need to separately put it on a test frame. Further, at time of the aforementioned operation test of the robot 27 and openers 26, the teaching position taught to the robot 27, that is, the position of the FOUP 25 for the reference position of the robot 27 can be registered as a movement position in the actual operation of the wafer transfer device 34 and the labor for the teaching operation of the robot movement position performed after assembly of the wafer transfer device 23 can be reduced.

Figure 6:
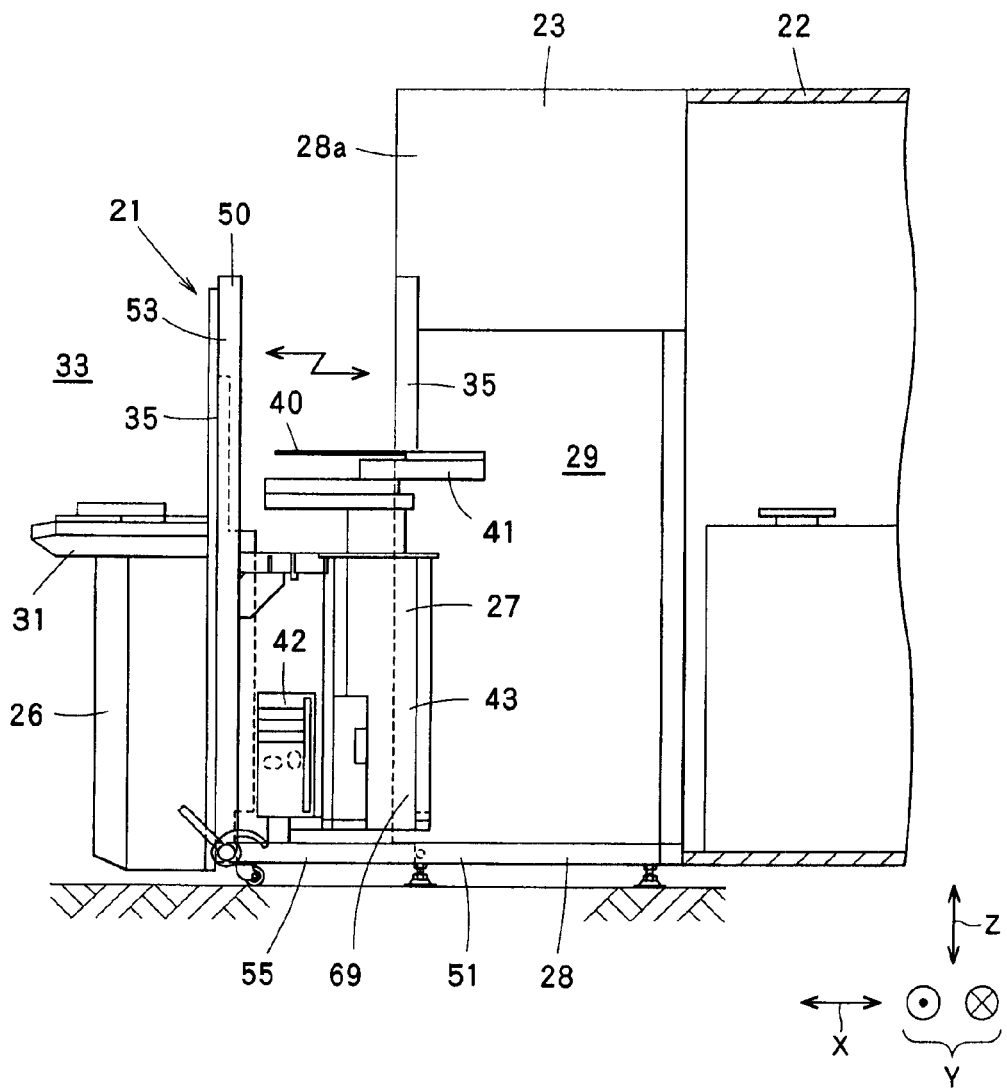
FIG. 6 is a sectional view showing the state that the transfer system unit 21 is separated from a main structural body 51.
Figure 7:
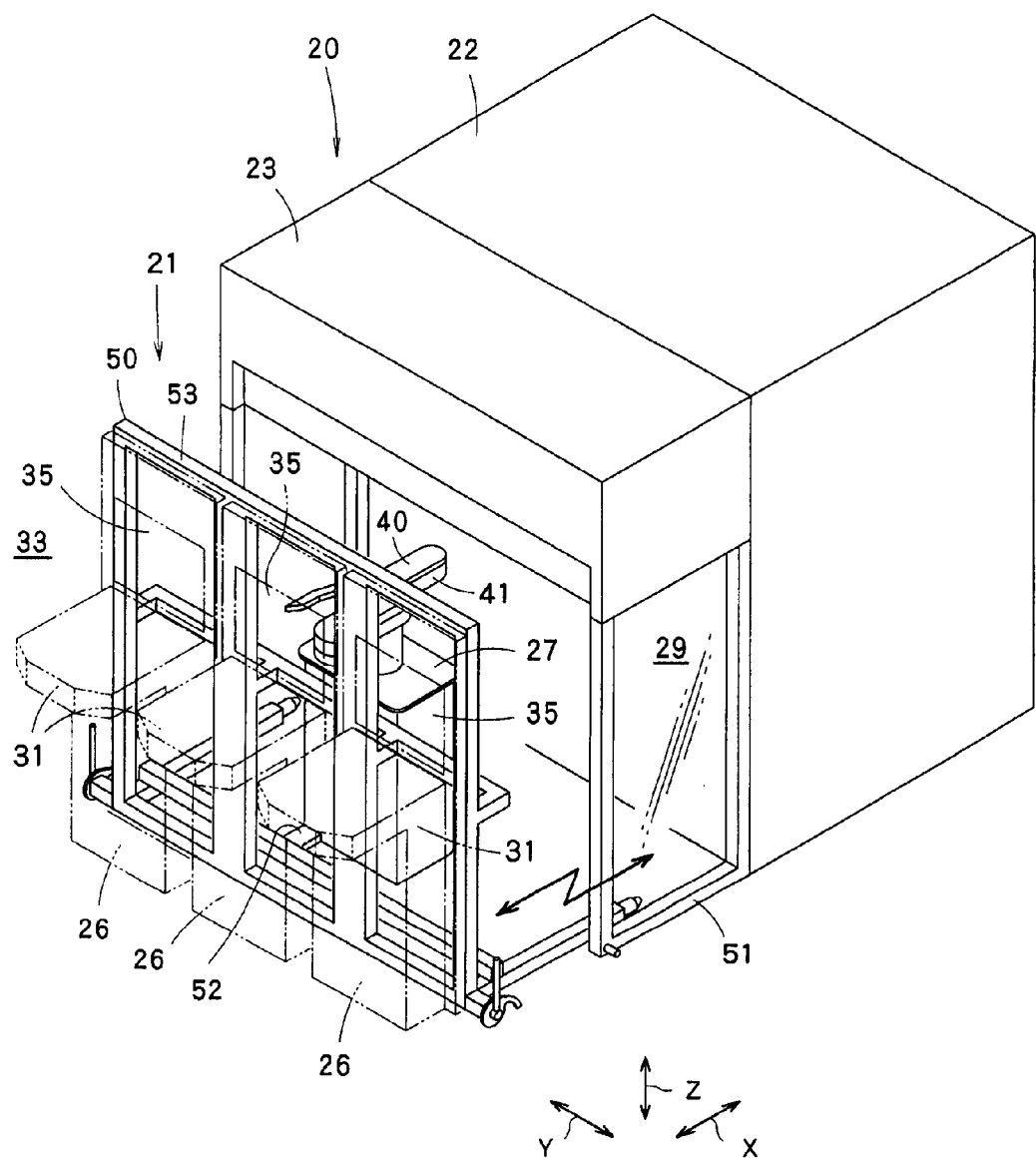
FIG. 7 is a perspective view showing the state that the transfer system unit 21 is separated from the main structural body 51.

Referring to FIGS. 6 and 7, the transfer system unit 21, even after completed as the wafer transfer device 23, can be separated from the main structural body 51. Concretely, a part of the front forming wall 28a becomes the frame divided body 50 and the frame divided body 50 is formed on the main structural body 51 and closes a front-side opening 69. The front-side opening 69 is formed larger than the minimum external shape of the robot 27 on the projection surface perpendicular to the wafer movement direction X.

Therefore, when the wafer transfer device 23 fails, if the transfer system 21 is separated from the main structural body 51 and slides in the wafer movement direction X, the robot 27 and openers 26 pass through the front side opening 69 and move from the preparation space 29 to the external space 33. By doing this, when the robot 27 and openers 26 move to the external space 33, the operations of the robot 27 and openers 26 can be confirmed. Namely, the transfer system unit 21 is pulled out in the sufficiently wide external space 33 compared with the preparation space 29, thus the operation confirmation of the robot 27 and openers 26 can be executed. By doing this, discovery of a faulty place and repair of the faulty place can be executed easily.

Referring to FIGS. 8 and 9, the frame divided body 50 includes the mounting section 54 (54a, 54b) mounted in the mounting position formed in the main structural body 51 and the guidance section 56 (56a, 56b) for guiding the mounting section 54 to the mounting position of the main structural body 51. In the main structural body 51, a mounted section 58 (58a, 58b) is formed and the mounting section 54 is fit into the mounted section 58. In this embodiment, the mounting section 54 includes a first mounting section 54a projected from the front end of the leg 55 in the wafer movement direction X and a second mounting section 54b projected from the opener fixing section 53 in the wafer movement direction X. In the main structural body 51, mounted sections 58a and 58b into which the first mounting section 54 and second mounting section 54b are fit are formed. In the mounted sections 58 (58a, 58b), fitting holes 57 (57a, 57b) into which the mounting sections 54 (54a, 54b) are fit are formed. The mounting sections 54 are respectively fit into the mounted sections 58, thus the position and posture of the transfer system unit 21 for the main structural body 51 are adjusted. In this embodiment, at the end of the transfer system unit 21 on one side of the wafer movement direction X, the first mounting section 54a is installed. Further, at the end of the transfer system unit 21 on the other side of the wafer movement direction X, the second mounting section 54b is installed. A pair of the first mounting section 54a and second mounting section 54b are installed on both sides of the width direction Y, thereby positioning can be achieved at the four corners under the transfer system unit 21 and the transfer system unit 21 can be mounted stably on the main structural body 51.

The mounting sections 54 and fitting holes 57 are formed in an almost same cross sectional shape perpendicular to the axial lines thereof. In this embodiment, the mounting section 54 is formed in a columnar shape and the diameter thereof is almost equal to the inner diameter of the fitting hole 57 formed in the mounted section 58. At the front end of each of the mounting sections 54, the guidance section 56 is formed in an almost conical shape coaxially with the mounting section 54. The guidance section 56 is formed so that the diameter of the place connected to the mounting section 54 is equal to that of the mounting section 54 and as it separates from the mounting section 54, it tapers off. The mounting section 54 is fit into the fitting hole 57 from the guidance section 56, thereby even if the fitting hole 57 and guidance section 56 are shifted slightly, the mounting section 54 can be fit into the fitting hole 57. The guidance section 56 is formed in this way, thus the mounting section 54 can be guided by the guidance section 56 and can be moved easily to the mounting position.

Further, as shown in FIG. 9, on the two legs 55 of the transfer system unit 21, wheels 65 are installed respectively. Therefore, the transfer system unit 21 can be transferred easily. For example, during maintenance, the transfer system unit 21 can be slid and separated from the main structural body 51.

Further, as shown in FIG. 9(1), when the transfer system unit 21 is separated naturally from the main structural body 51, the axial line L3 of the mounting section 54 is arranged below the axial line L2 of the fitting hole 57 by a predetermined distance d. Therefore, as shown in FIG. 9(2), when the transfer system unit 21 is mounted on the main structural body 51, if the axial line L2 of the fitting hole 57 coincides with the axial line L3 of the mounting section 54, compared with the natural state, the axial line L3 of the mounting section 54 is arranged above the axial line L2 of the fitting hole 57 by a predetermined distance d. Therefore, the effect of the wheels 65 is eliminated and the transfer system unit 21 can be positioned.

Figure 10:
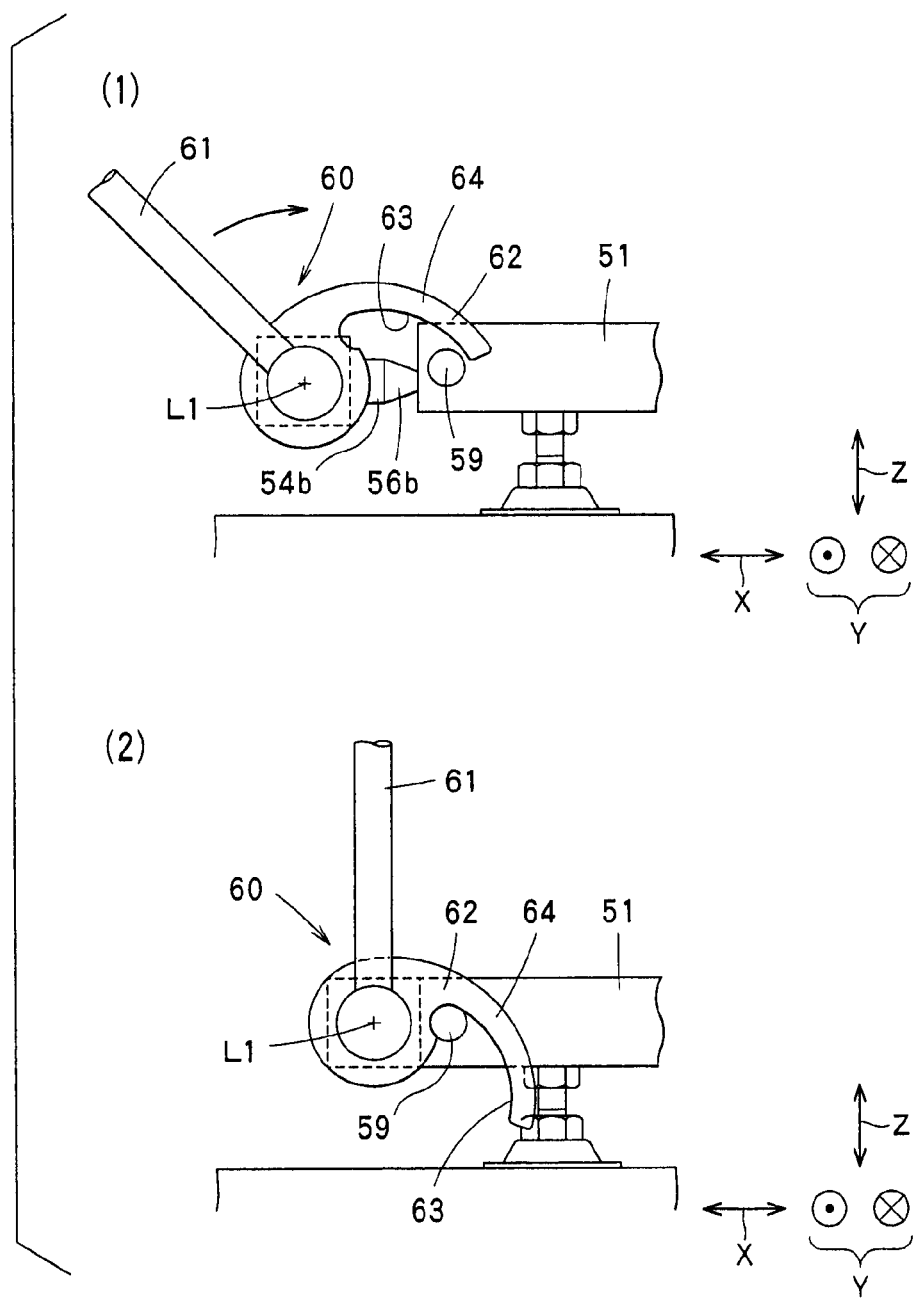
FIG. 10 includes front views showing a mounting support member 60.

Referring to FIG. 10, a mounting support member 60 for supporting the mounting operation of the transfer system unit 21 by an operator is installed on the frame divided body 50 and main structural body 51.

FIG. 10(1) shows the state that the transfer system unit 21 is separated from the main structural body 51. FIG. 10(2) shows the state that the transfer system unit 21 is mounted on the main structural body 51. The mounting support member 60 is structured so as to include a lever section 61 installed so as to execute angular displacement around the angular displacement axial line L1 for the frame divided body 50, an angular displacement section 62 fixed to the lever section 61 for executing angular displacement around the angular displacement axial line L1 together with the lever section 61, and a pin section 59 installed in the main structural body 51. On the angular displacement section 62, a stop section 64 for executing angular displacement around the angular displacement axial line L1 and changing so as to reduce the distance from the angular displacement axial line L1 is formed. The stop section 64 has a stop guidance surface 63 facing on the angular displacement axial line L1 for moving around the angular displacement axial line L1, thereby changing smoothly the distance from the angular displacement axial line L1.

As shown in FIG. 10(1), the guidance section 56b is partially inserted into the fitting hole 57b (FIGS. 8 and 9), thus the pin section 59 is arranged inside the stop section 64. In this state, as shown in FIG. 10(2), the lever section 61 executes angular displacement, thus the pin section 59 slides on the stop guidance surface 63 of the stop section 64 and the angular displacement section 59 gives force to the pin section 59. The angular displacement section 62 receives reaction force from the pin section 59, thereby is given force toward the main structural body 51, and the transfer system unit 21 is shifted, and the mounting section 54 is fit into the fitting hole 57.

The angular displacement section 62 executes angular displacement by the lever section 61, thus this principle can be used, and the transfer system unit 21 can be mounted on the main structural body 51 by small force. Therefore, as in this embodiment, even if the transfer system unit 21 must be moved up to mount the transfer system unit 21 on the main structural body 51, the transfer system unit 21 can be moved up easily by an operator and the transfer system unit 21 and main structural body 51 can be mounted easily.

Further, the pin section 59 makes contact with the stop guidance surface 63, thus the mounting support member 60 becomes a displacement prevention means for preventing mechanically the displacement of the transfer system unit 21 from the main structural body 51. Therefore, the transfer system unit 21 can be prevented from being shifted undesirably from the main structural body 51. Further, the mounting section 54, guidance section 56, mounting support member 60, and wheels 65 compose a constitution of this embodiment and can be changed properly. For example, a concavity may be formed in the mounting section 54 and a convexity may be formed in the mounted section 58. Further, in the legs 55, a fitting section fit into a rail formed in the main structural body 51 may be formed. Therefore, the transfer system unit 21, in the state that it is positioned to the structural body of the main unit 51, can slide and move. Further, the transfer system unit 21 and main structural body 51 may be fixed removably by bolts and nuts.

Figure 11:
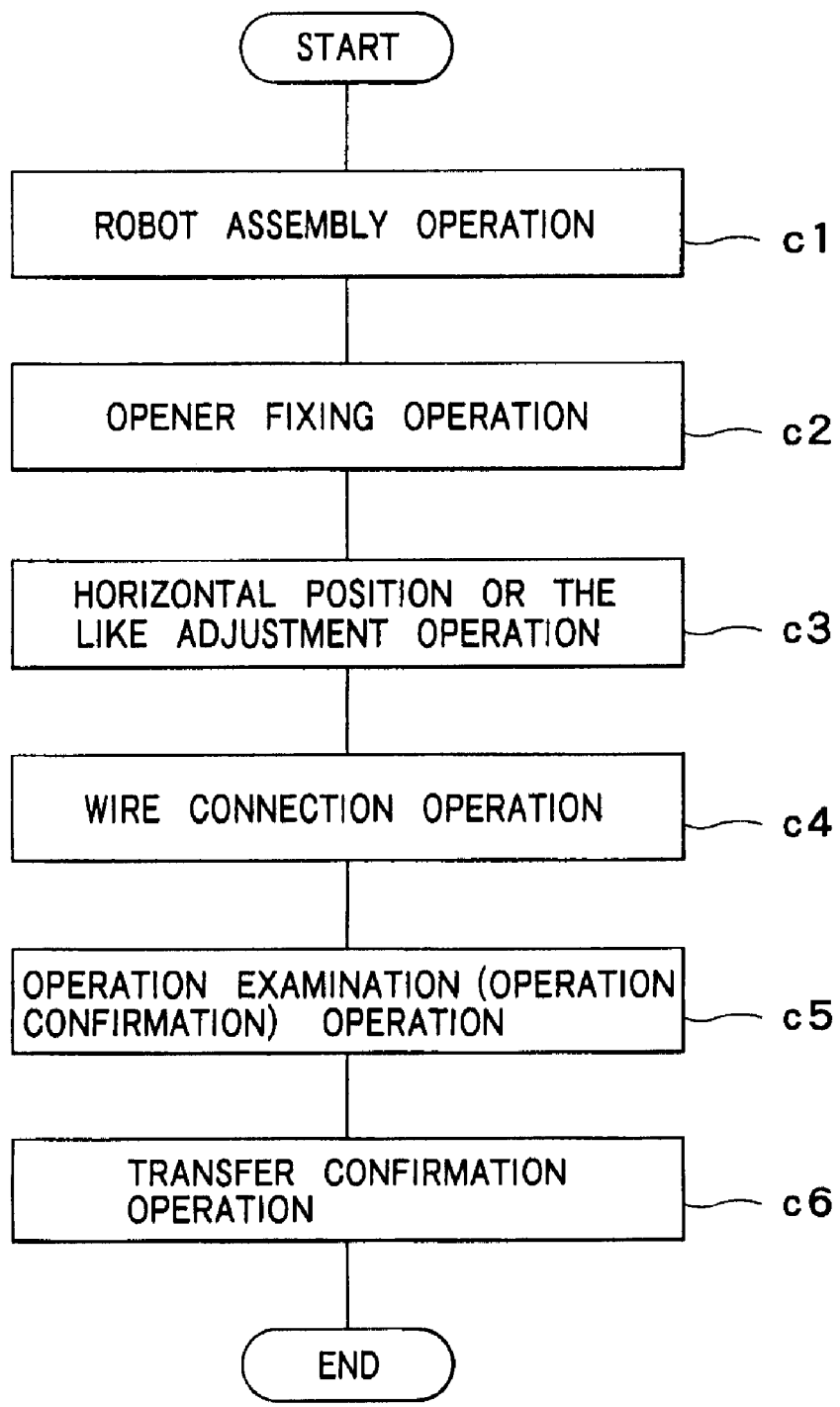
FIG. 11 is a flow chart showing the operation procedure from manufacture to shipment of the transfer system unit 21 which is an embodiment of the present invention.

FIG. 11 is a flow chart showing the operation procedure from manufacture to shipment of the transfer system unit 21 which is an embodiment of the present invention. The transfer system unit 21 can be manufactured in a different place from the installation place of the wafer transfer device 23. In this embodiment, the transfer system unit 21 is assembled by a robot manufacturer. Firstly, when the robot manufacturer completes preparation of a plurality of components composing the frame divided body 50 and robot 27, the robot manufacturer goes to Step c1 and starts operation. At Step c1, the robot manufacturer fixes the base 43 of the robot 27 to the frame divided body 50, integrally assembles the frame divided body 50 and robot 27, and when the assembly is completed, goes to Step c2. At Step c2, the robot manufacturer fixes the openers 26 to the frame divided body 50 to which the robot 27 is fixed. When the transfer system unit 21 is assembled in this way, the robot manufacturer goes to Step c3.

At Step c3, the robot manufacturer adjusts the positions and postures of the robot 27 and openers 26 to the frame divided body 50 and adjusts the relative positional relationship between the robot 27 and the openers 26. Concretely, using a level and a positioning jig, the robot manufacturer adjusts the positions of the robot 27 and openers 26 so that the relative positional relationship and postures of the robot 27 and openers 26 are set in the same state as that when operated as the wafer transfer device 23. When the adjustment is completed like this, the robot manufacturer goes to Step c4.

At Step c4, the robot manufacturer connects the wires so that the robot 27 and openers 26 can operate. Concretely, for the robot 27 and openers 26, an operation instruction cable is connected to the controller 42, and a power transfer cable is connected to the power source. And, the robot manufacturer goes to Step c5. At Step c5, the robot manufacturer allows the robot 27 to perform a simulation operation simulating the operation of the robot 27 performed as the wafer transfer device 23. Therefore, the robot manufacturer performs simultaneously the operation examination of the robot 27 and operation confirmation of the transfer system unit 21. Concretely, the robot manufacturer actually arranges the FOUP 25 on the FOUP retainer 31 of the openers 26 and teaches the FOUP position to the robot 27. And, the robot manufacturer allows the robot 27 to perform the operation of transferring the wafers 24 to be stored in the FOUP 25 and goes to Step c6. As an operation examination at Step c5, other examinations such as the speed, accuracy, and function of the robot 27 may be executed simultaneously. At Step c6, the robot manufacturer confirms whether the transfer operation of the wafers 24 can be performed by the robot 27 or not, and when it is confirmed that the transfer operation can be performed, the robot manufacturer ships the transfer system unit 21 to the installation place of the wafer transfer device 23, and the robot operator finishes the procedure from assembly to shipment.

There is a case that at the manufacture step of the transfer system unit 21, the openers 26 actually used for the wafer transfer device 23 are not supplied. In this case, the robot manufacturer performs the operations at Steps c5 and c6 in the state that dummy openers equivalent to the openers 26 actually used as a wafer transfer device 23 are mounted on the frame divided body 50. In this case, compared with a case that the openers 26 used as the wafer transfer device 23 are fixed to the frame divided body 50, although the operation efficiency is lowered, the operation efficiency as a whole can be improved in comparison to the conventional art.

Figure 12:
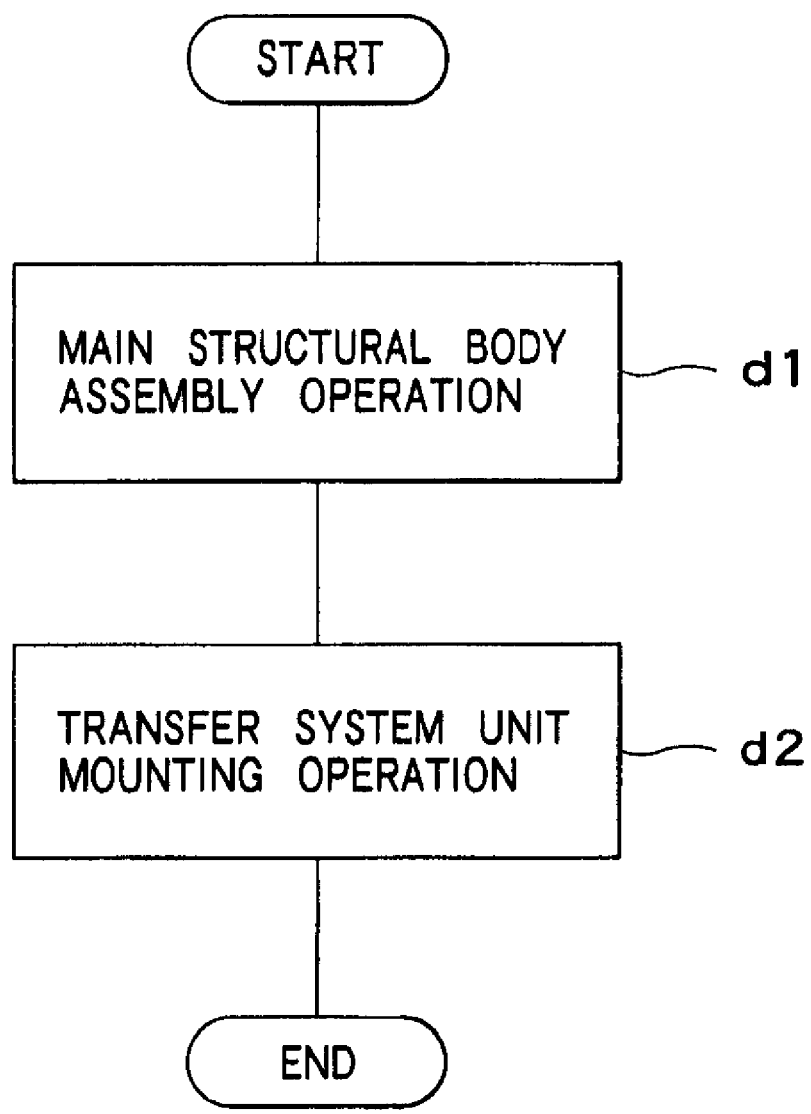
FIG. 12 is a flow chart showing the assembly procedure of a wafer transfer device 23 of an embodiment of the present invention.

FIG. 12 is a flow chart showing the assembly procedure of the wafer transfer device 23 which is an embodiment of the present invention. The wafer transfer device 23 is so large that it is assembled in the installation place thereof. Firstly, the assembly company of the wafer transfer device 23, when the preparation of a plurality of components composing the main structural body 51 of the wafer transfer device 23 is completed, goes to Step d1 and starts operation. At Step d1, the assembly company assembles the main structural body 51 and when the assembly is completed, goes to Step d2. The main structural body 51 may be assembled together with the wafer processing unit 22. And, when the assembly of the main structural body 51 is completed, the assembly company goes to Step d2.

At Step d2, the assembly company mounts the transfer system unit 21 assembled by the robot manufacturer beforehand on the main structural body 51. And, the assembly company confirms whether the operation performed by the robot manufacturer is performed normally or not and completes the assembly of the wafer transfer device 23. When operating it as a semiconductor processing equipment 20, at the step that the assembly of the wafer transfer device 23 and wafer processing unit 22 is completed, it is necessary to teach the wafer arrangement position of the wafer processing unit 22 to the robot 27 and to arrange the wafer 24 retained by the robot 27 in the wafer arrangement position and retain the wafer 24 arranged in the wafer arrangement position by the robot 27, it is necessary to confirm the operation.

As mentioned above, according to this embodiment, at Step c3, for the frame divided body 50, the positions and postures of the robot 27 and openers 26 are adjusted. Further, at Step c5, the operation examination of the robot relating to access to the FOUPs 25 retained by the openers 26 can be executed. In this way, the position adjustment and operation examination of the robot 27 and openers 26 can be completed before assembly of the wafer transfer device 23. Therefore, at Step d2, the labor of the position adjustment and operation examination of the robot 27 and openers 26 after the transfer system unit 21 is mounted on the main structural body 51 can be reduced. The transfer system unit 21 for which the position adjustment and operation examination are executed like this is prepared, thus the assembly operation in the installation place of the wafer transfer device 23 can be simplified and the wafer transfer device 23 can be assembled in a short time.

Further, in the wafer transfer device 23, the robot 27 and openers 26 which are devices for transferring the wafers 24 are required for high assembly accuracy and a strict operation examination is executed. In this embodiment, before assembly of the wafer transfer device 23, the assembly accuracy and operation quality required for the wafer transfer system can be obtained, so that there is no need to prepare a skilled operator and an exclusive jig at each installation place of the wafer transfer device 23. Further, in this embodiment, they are shipped to the installation place of the wafer transfer device 23 as a transfer system unit 21 including the robot controller 43 in the state that the wire connection has already been executed, so that the wiring operation can be simplified.

Further, at the operation examination step at Step c5, the positions of the FOUPs 25 retained by the openers 26 are taught to the robot 27, and the robot 27 is moved to the teaching position, and the simulation operation relating to wafer transfer is performed by the robot 27, and the operation examination is executed. And, the teaching position of the robot used for the operation examination at Step c5 can be decided as a position of the robot 27 when operating as the wafer transfer device 23. Therefore, after the wafer transfer device 23 is assembled, the teaching operation of the robot 27 can be simplified and in a short time after assembly of the wafer transfer device 23, the wafer transfer device 23 can be made operable.

Further, in this embodiment, as shown at Steps c1 to c5, the forming operation of the transfer system unit 21 and operation examination operation are performed in the robot manufacturing place. By doing this, the quality of the robot 27 can be ensured in the robot manufacturing place. Therefore, the examination by the simulation operation conventionally performed to ensure the quality of the robot 27 in the robot manufacturing place and the operation examination performed in the installation place of the substrate transfer device can be unified, and the overall operation time can be shortened, and the operability can be improved. Further, in the installation place of the wafer transfer device 23, after the main structural body 51 required for low assembly accuracy is assembled, the transfer system unit 21 with a guarantee of accuracy is mounted on the main structural body 51, thus the wafer transfer device 23 can be assembled very easily.

Further, in this embodiment, the transfer system unit 21 keeps a self-supporting posture and keeps the same posture as that when it is mounted on the main structural body 51. Therefore, the robot manufacturer can use the same one divided frame as a shipment frame for keeping the transfer system unit 21 in a stable posture, a test frame for executing the operation test of the robot, and an assembly frame used for assembly of the robot. Therefore, there is no need to re-put sequentially the robot 27 on a plurality of frames, so that those frames are unnecessary and the cost can be decreased. Further, as mentioned above, the time required to re-put the robot on each frame can be saved and potential troubles caused at time of re-putting can be prevented.

Further, the forming operation and operation examination of the transfer system unit 21 are executed in the robot manufacturing place, thus a skilled operator relating to the robot 27 can execute fixing and positioning of the robot 27 to the frame divided body 50 and the teaching operation of the operation position of the robot 27 and the operation examination. Therefore, those operations can be prevented from imperfection. Further, defects caused in each operation can be solved early.

Further, the wafer transfer device 23 is a part in the semiconductor manufacturing equipment 20 which can be shared easily. Therefore, even in a plurality of semiconductor processing equipments 20 for performing different processes, a common wafer transfer device 23 is often installed. In such a case, it is a large advantage to form the transfer system unit 21 beforehand. For example, it is possible to manufacture a plurality of transfer system units 21 for which the position adjustment and operation confirmation are executed in the robot manufacturing place and store the transfer system unit 21 manufactured until the transfer system unit 21 is requested for shipment. Therefore, compared with a case that the transfer system unit 21 is assembled after the shipment request is given, the transfer system unit 21 can be shipped in a short time.

Figure 13:
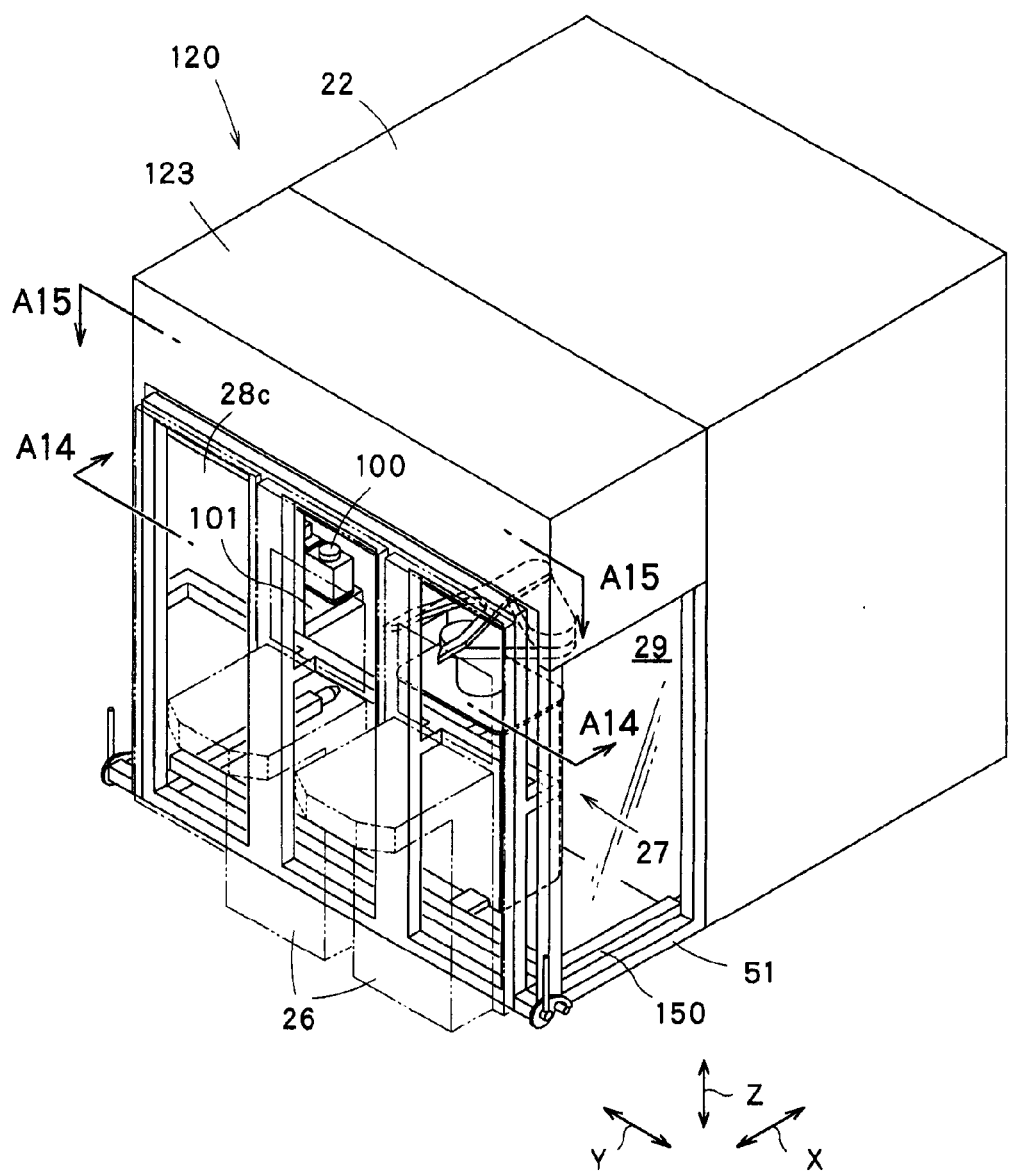
FIG. 13 is a perspective view showing a semiconductor processing equipment 120 of a second embodiment of the present invention.
Figure 14:
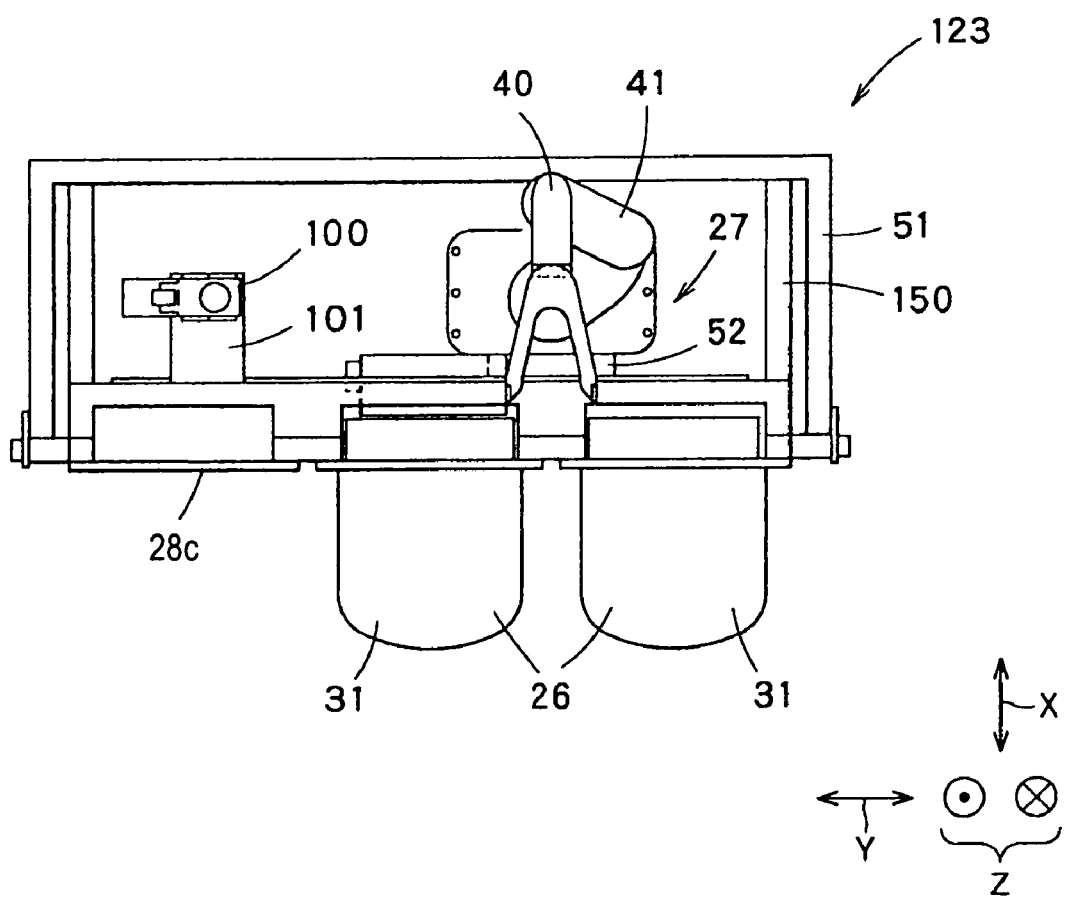
FIG. 14 is a sectional view showing the semiconductor processing equipment 120 cut along the sectional line of the arrow A14-A14 shown in FIG. 13.
Figure 15:
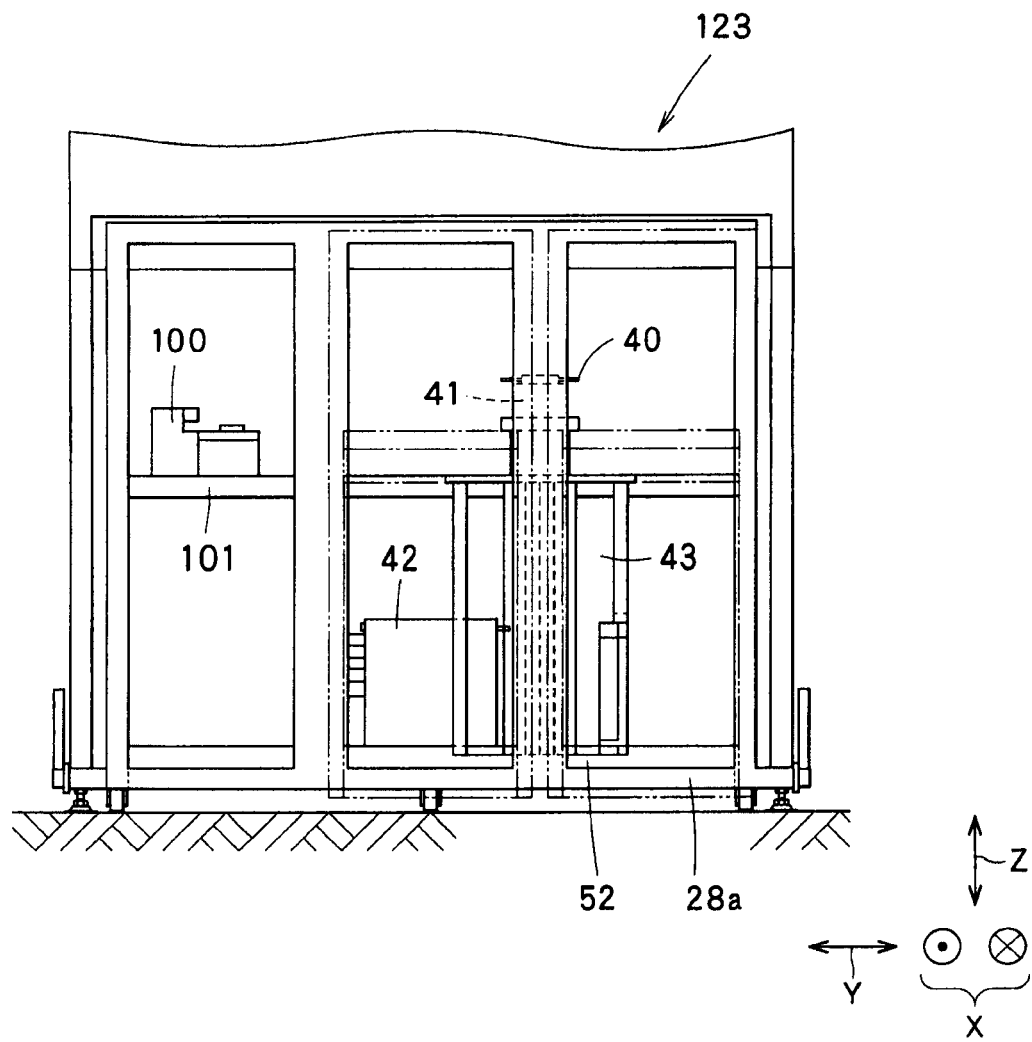
FIG. 15 is a sectional view showing the semiconductor processing equipment 120 cut along the sectional line of the arrow A15-A15 shown in FIG. 13.

Referring to FIGS. 13 to 17, a semiconductor processing equipment 120 including the second embodiment of the present invention will be explained hereunder. In FIG. 13, for easy understanding, with respect to the FOUP openers 26 and a part of the wall 28c, only the outline of each of them is drawn, so that the FOUP openers and a part of the wall 28c can be seen through.

A wafer transfer device 123 of the semiconductor processing equipment 120 of the second embodiment has an aligner 100 in addition to the openers 26 and robot 27. The aligner 100 is a device for aligning the direction of each of the wafers 24. With respect to the semiconductor processing equipment 120 of the second embodiment, the same constitution as that of the semiconductor processing equipment 20 of the first embodiment is assigned with the same reference numerals as those of the first embodiment and the explanation will be omitted.

The robot 27 retaining the wafer 24 arranges the wafer 24 in the wafer arrangement position set in the aligner 100, thus the aligner 100 rotates the wafer 24, aligns the direction of the wafer 24, and then retains it. The robot 27 retains the wafer 24 whose direction is aligned, thus it can arrange the wafer 24 in the processing position of the wafer processing unit 22 without shifting the direction of the wafer 24. The aligner 100 is also arranged in the preparation space 29. In this case, a transfer system unit 121 of the wafer transfer device 123 has the aligner 100 in addition to the openers 26 and robot 27.

Figure 16:
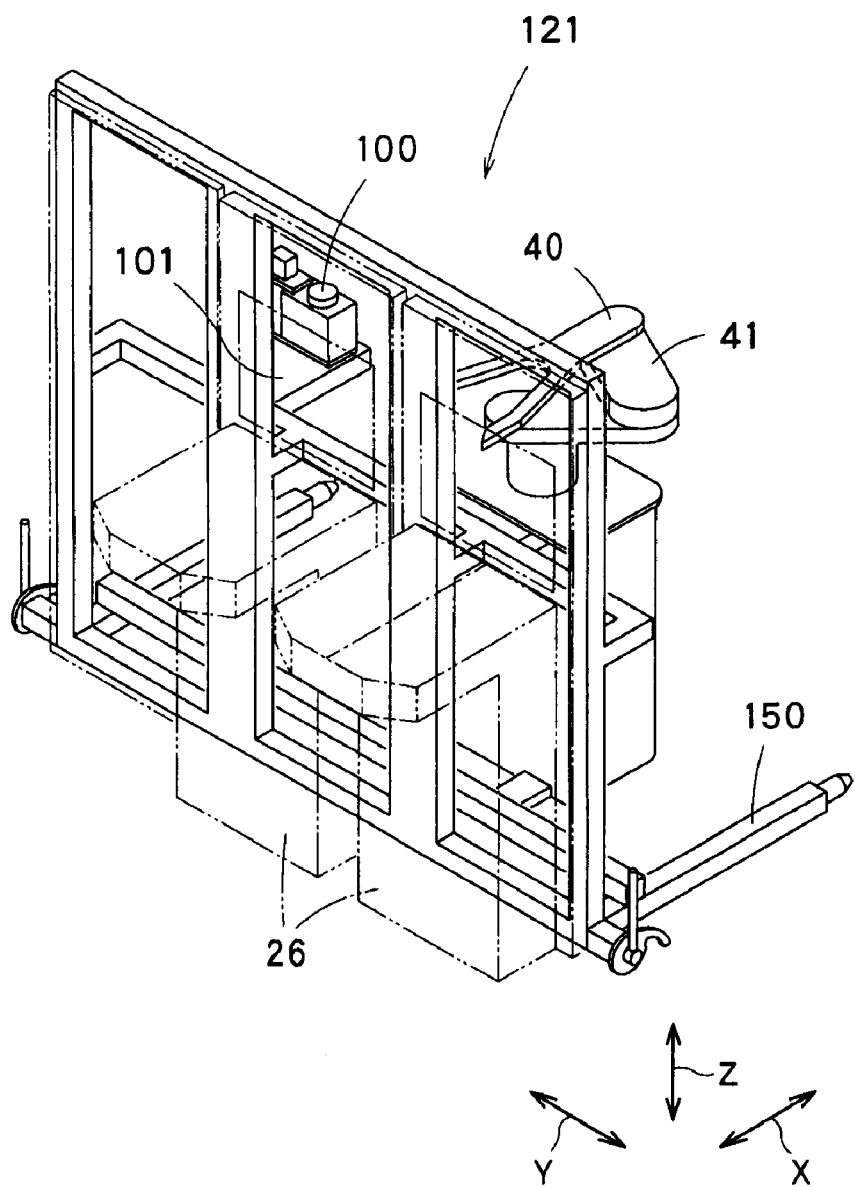
FIG. 16 is a perspective view showing the transfer system unit 121.

FIG. 16 is a perspective view showing the transfer system unit 121. The transfer system unit 121 has the same constitution as that of the transfer system unit 21 of the first embodiment except that an aligner fixing section 101 for fixing the aligner 100 is formed. A frame divided body 150, when mounted on the main structural body 51 of the wafer transfer device 23, is arranged in the arrangement position where the aligner 100 fixed to the frame divided body 150 is to be positioned as a part of the wafer transfer device 23 and in the posture. Further, the frame divided body 150, when operating actually as a wafer transfer device 123, if the relative positional relationship between the robot 27 and the aligner 100 is preset, fixes the robot 27 and aligner 100 respectively to the fixing sections 52 and 101 so that they are set in the preset relative positional relationship. Further, the frame divided body 150, when mounted in the main structural body 51 of the wafer transfer device 23, fixes the aligner 100 so that the position of the reference point and posture of the reference surface which are set in the aligner 100 are set in a preset state. Further, the transfer system unit 121 can operate the aligner 100 before it is mounted on the main structural body 51.

Figure 17:
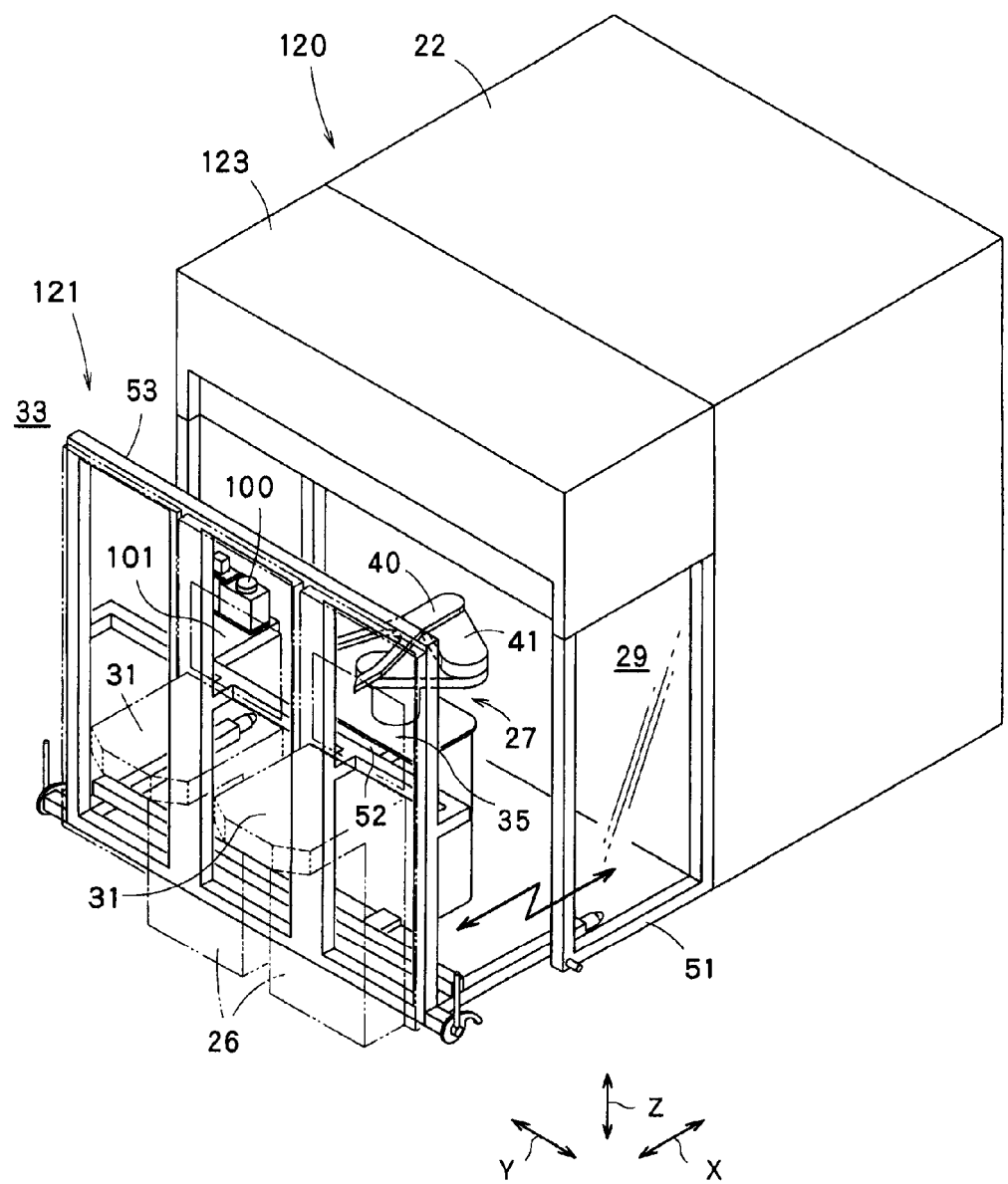
FIG. 17 is a perspective view showing the state that the transfer system unit 121 is separated from the main structural body 51.
Figure 18:
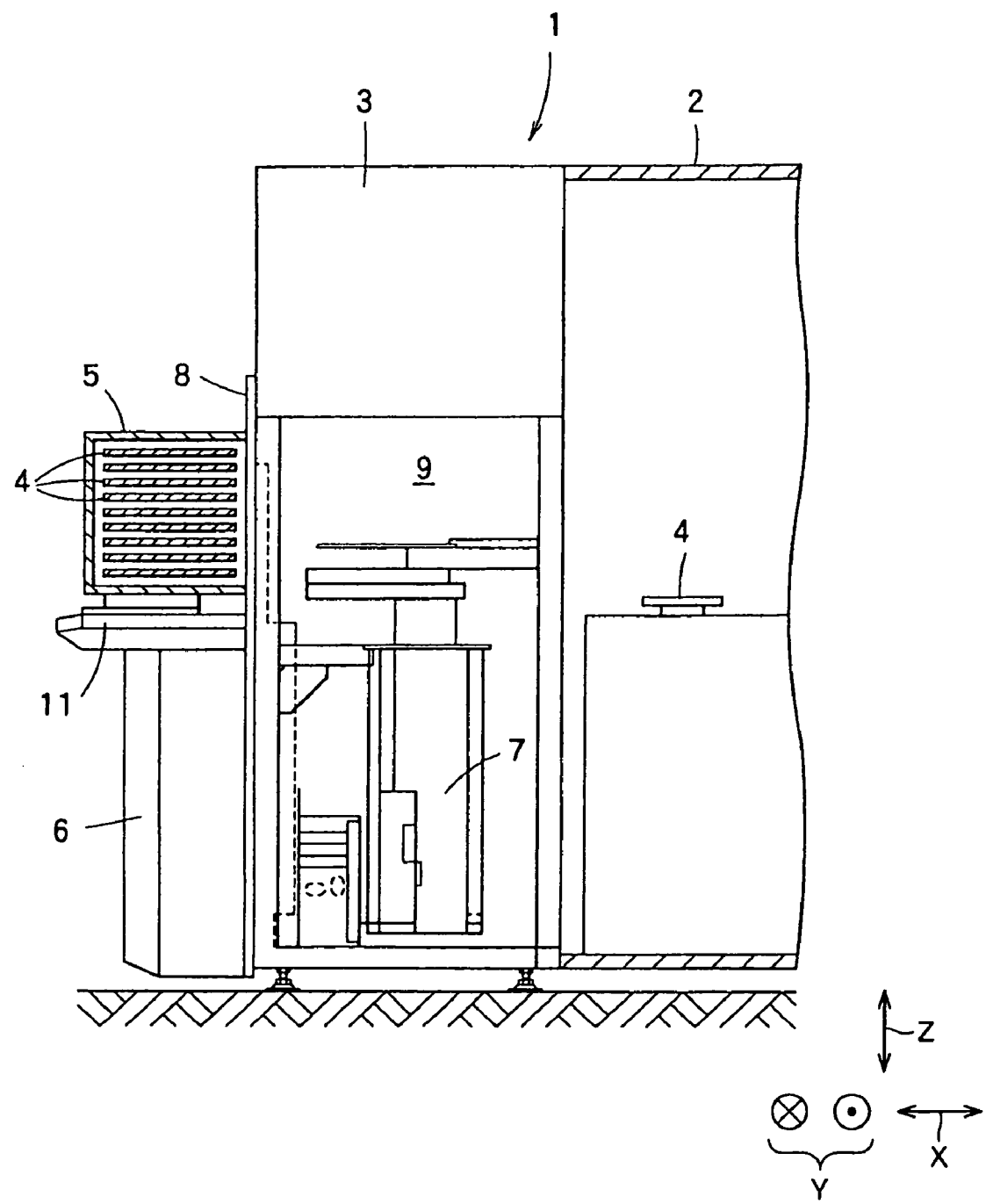
FIG. 18 is a sectional view showing a cut part of a semiconductor processing equipment 1 of the related art.
Figure 19:
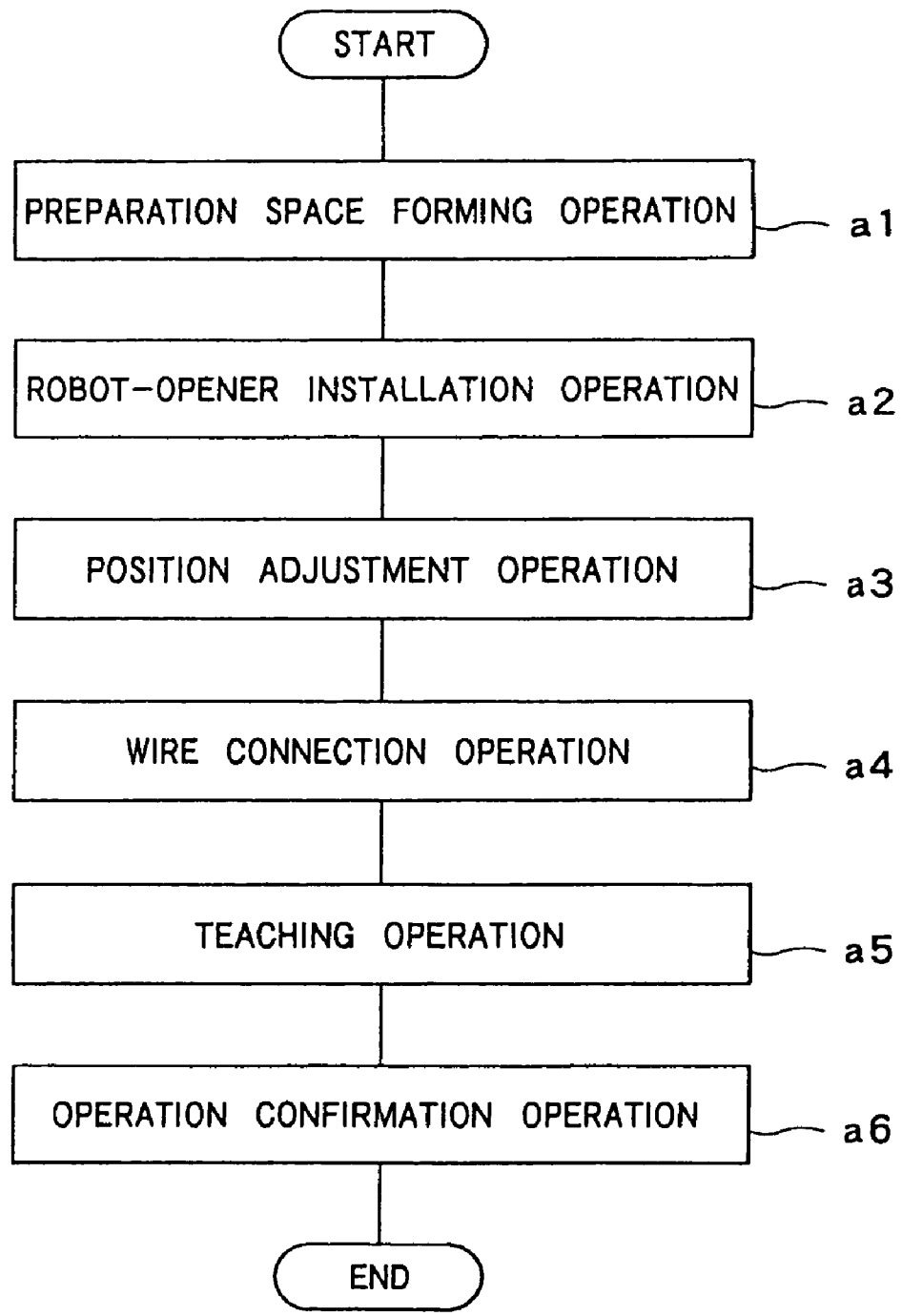
FIG. 19 is a flow chart showing the conventional assembly procedure of a wafer transfer device 3 which is performed by an assembly company.
Figure 20:
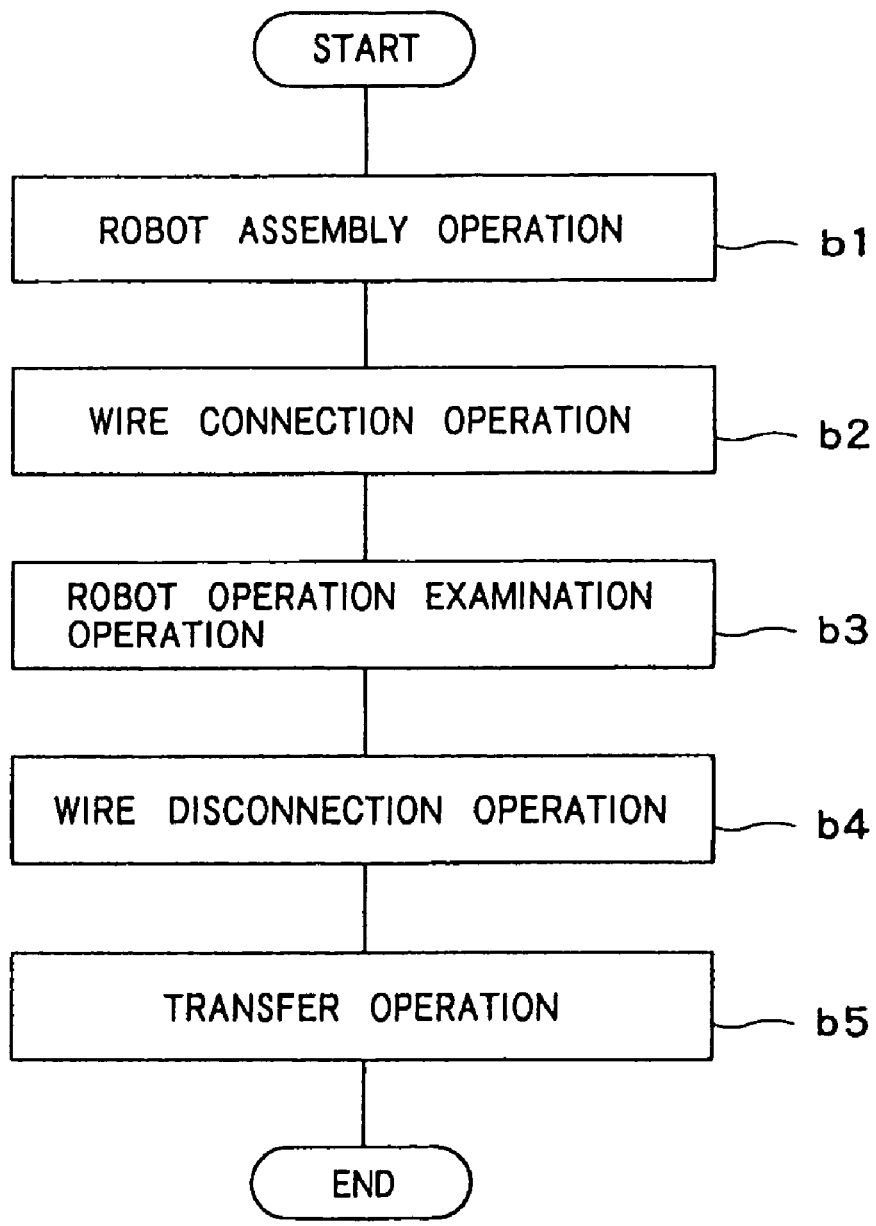
FIG. 20 is a flow chart showing the operation procedure from manufacture to shipment of the robot for the wafer transfer device which is performed by a robot manufacturer.

Referring to FIG. 17, the transfer system unit 121, similarly to the first embodiment, is structured so as to be separated from the main structural body 51. When the main structural body 51 is structured, the transfer system unit 121 is structured so as to fit and even after it is completed as the wafer transfer device 123, the transfer system unit 121 can be separated from the main structural body 51.

Also in the second embodiment aforementioned, the same effect as that of the first embodiment can be obtained. Further, the transfer system unit 121 including the aligner 100 is formed, so that the assembly operation in the installation place of the wafer transfer device 123 can be simplified more and the wafer transfer device 123 can be assembled in a short time. Further, in this embodiment, the aligner 100 is fixed to the frame divided body 50, though another device may be fixed to the frame divided body 50. For example, a plate thickness measuring instrument for measuring the thickness of the wafers 24 or a wafer retaining means in the buffer position for improving the operation efficiency may be installed. As mentioned above, a device and a member in which a substrate standby section positioned in the preparation space 29 for arranging temporarily the wafers 24 is formed may be installed in the frame divided body 150. As mentioned above, in the transfer system unit 121, among the constituent devices necessary for transfer of the wafers 34, at least two may be fixed to the frame divided body 150. For example, the robot 27 and aligner 100 may be fixed to the frame divided body 150.

The aforementioned embodiment is only an example of the present invention and the constitution may be modified within the scope of the invention. For example, in this embodiment, as an objective substrate, the semiconductor wafers 24 are explained. However, for a substrate other than the semiconductor wafers, for example, a glass substrate, the same effect can be obtained. Further, as a substrate container, the FOUP 25 is used, though it may be an open cassette. In this case, in place of the FOUP openers 26, a retainer retaining the open cassette positioned is fixed to the fixing section of the frame divided body 50.

Further, in this embodiment, a part of the frame of the wafer transfer device 23 is formed as a divided body, though the divided body may be formed by a part other than the frame. Concretely, it is enough that a transfer structural body such as the robot 27 and openers 26 can be fixed to the divided body and the divided body can be removed from the main structural body 51.

Further, the procedures shown in FIGS. 11 and 12 are examples of this embodiment and another procedure may be used. For example, before the position adjustment operation at Step c3 is executed, the transfer system unit 21 may be assembled and after the openers 26 are fixed to the frame divided body 50, the robot 27 may be fixed. Further, the transfer system unit 21 is assembled at the robot manufacturing site in the embodiment, though it may be assembled in the neighborhood of the installation place of the wafer transfer device 23. Also in this case, the main structural body 51 and transfer system unit 21 can be assembled side by side and the aforementioned effect can be obtained. Further, by use of the frame divided body 50 of this embodiment, even if the aforementioned procedures are not used, a characteristic effect of realizing easy maintenance can be produced.

Further, in this embodiment, the openers 26 fixed to the frame divided body 50 in the robot manufacturing place is actually used as a part of the wafer transfer device 23. However, if the attaching accuracy of the openers 26 is within the tolerance, openers 26 different from the openers 26 which are attached in the robot manufacturing place and for which the operation examination is executed may be attached to the frame divided body 50 at the installation site of the wafer transfer device 23.

Although the invention has been described in its preferred embodiments with a certain degree of particularity, obviously many changes and variations are possible therein. It is therefore to be understood that the present invention may be practiced otherwise than as specifically described herein without departing from the scope and spirit thereof.

What is claimed is:

1. A substrate transfer device for transferring a substrate to or from a substrate processing device for processing a substrate in a predetermined atmosphere, the substrate transfer device comprising a main structural body and a transfer system unit which is configured to be removably mounted on the main structural body as a residual part of the substrate transfer device;

wherein:

the transfer system unit comprises:
a frame body which can be mounted on and divided from the main structural body, the frame body having a first side and a second side;
a robot, the robot being fixed to the frame body; and
a substrate container retainer, the substrate container retainer being fixed to the frame body;

the main structural body has a preparation space for receiving the robot, the robot being positioned in the preparation space when the frame body is mounted on the main structural body;

the robot and the substrate container retainer are respectively arranged in predetermined positions on the transfer system unit such that the robot and the substrate container retainer form parts of the substrate transfer device when the transfer system unit is mounted on the main structural body;

the transfer system unit is adapted to maintain a self supporting posture when the transfer system unit is separated from the main structural body;

the frame body is provided with a respective leg section at each side of the frame body for maintaining the self supporting posture of the transfer system unit, and the frame body is provided with a respective pair of mounting sections at each side of the frame body, each pair of the mounting sections being located at points that are proximal to opposite ends of a respective one of the leg sections and configured to be mounted in a pair of mounting positions formed in the main structural body.

2. A substrate transfer device according to claim 1, wherein each of the mounting sections is provided with a guidance section configured to guide the mounting section to the mounting position.

3. A substrate transfer device according to claim 2, wherein the guidance section is tapering toward an end thereof.

4. A substrate transfer device according to claim 1, further comprising a mounting support member configured to be able to engage with a pin section formed on the main structural body, the mounting support member including a lever section configured to be able to execute an angular displacement around an axis parallel to a width direction, and a stop section configured to execute an angular displacement around the axis together with the lever section, the stop section having a stop guidance surface facing the axis, a distance between the stop guidance surface and the axis changing smoothly around the axis.

* * * * *